(12) United States Patent
Choi et al.

(10) Patent No.: US 11,610,960 B2
(45) Date of Patent: Mar. 21, 2023

(54) ORGANIC LIGHT EMITTING DIODE DISPLAY DEVICE

(71) Applicant: Samsung Display Co., Ltd., Yongin-si (KR)

(72) Inventors: Jun Won Choi, Hwaseong-si (KR); Dong Eup Lee, Asan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 166 days.

(21) Appl. No.: 16/942,132

(22) Filed: Jul. 29, 2020

(65) Prior Publication Data

US 2021/0134925 A1  May 6, 2021

(30) Foreign Application Priority Data

Nov. 6, 2019  (KR) .................. 10-2019-0140957

(51) Int. Cl.
*H01L 27/32* (2006.01)
*H01L 51/52* (2006.01)

(52) U.S. Cl.
CPC ...... *H01L 27/3276* (2013.01); *H01L 27/3258* (2013.01); *H01L 51/5253* (2013.01)

(58) Field of Classification Search
CPC ............ H01L 27/3276; H01L 27/3258; H01L 27/3265; H01L 27/3262; H01L 51/5253; H01L 51/5256
See application file for complete search history.

(56) References Cited

U.S. PATENT DOCUMENTS

| | | | |
|---|---|---|---|
| 2013/0056736 A1* | 3/2013 | Kim | G09G 3/3677 438/34 |
| 2015/0014635 A1* | 1/2015 | Noh | H01L 51/5253 257/40 |

FOREIGN PATENT DOCUMENTS

KR  10-2015-0081728 A  7/2015

* cited by examiner

*Primary Examiner* — Vongsavanh Sengdara
(74) *Attorney, Agent, or Firm* — Lewis Roca Rothgerber Christie LLP

(57) ABSTRACT

An organic light emitting diode display device includes a substrate, a pixel structure, a first circuit transistor, a first lower electrode, a first upper electrode, and a planarization layer. The substrate has a display area and a peripheral area including a first circuit area, a second circuit area, and a blocking area positioned between the first and second circuit areas. The pixel structure is in the display area on the substrate. The first circuit transistor is in the first circuit area on the substrate. The first lower electrode is in the blocking area on the substrate. The first upper electrode is on the first lower electrode, and the first upper electrode and the first lower electrode constitute a first capacitor. The planarization layer is on the substrate, and has a first opening that overlaps the first capacitor in the blocking area.

20 Claims, 23 Drawing Sheets

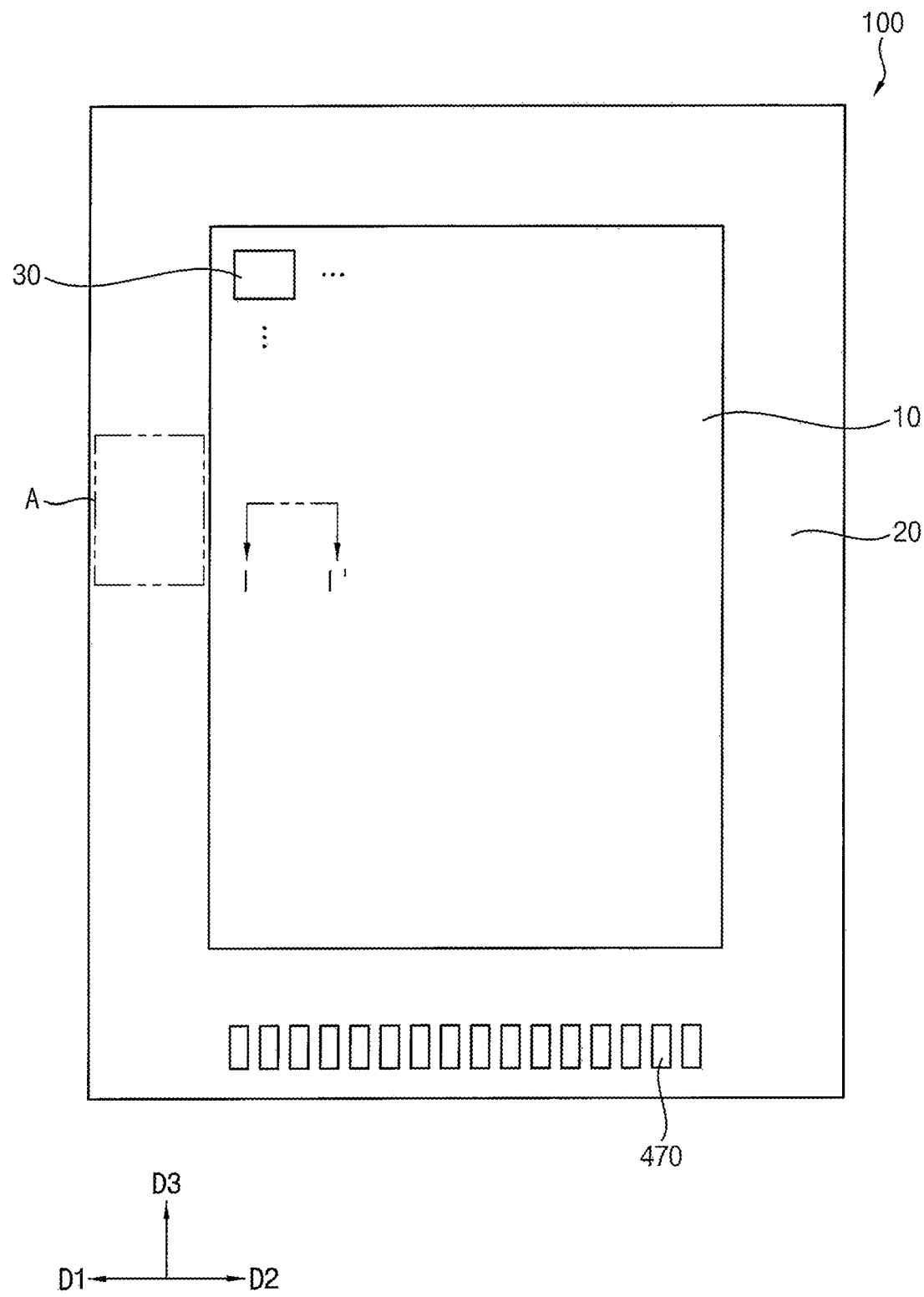

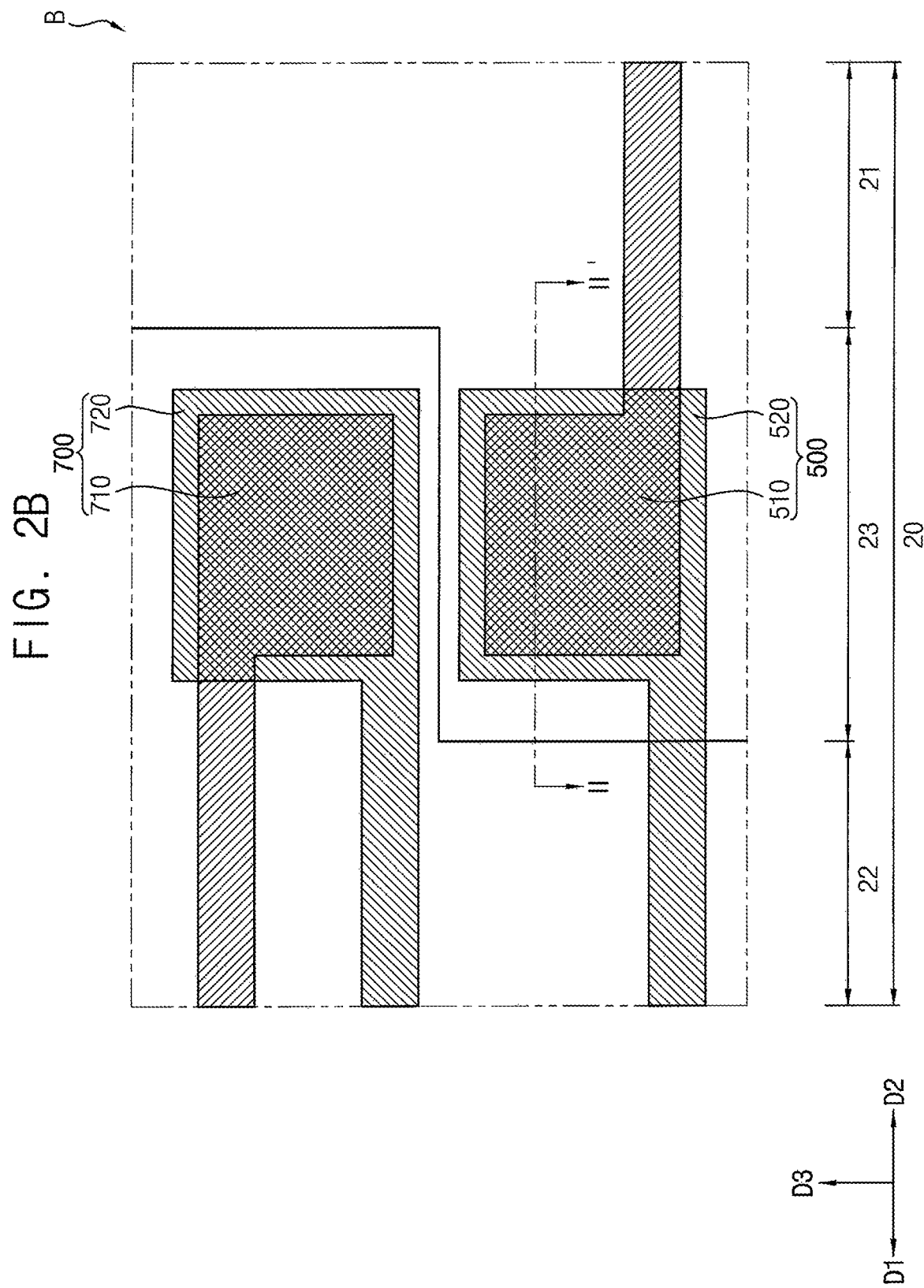

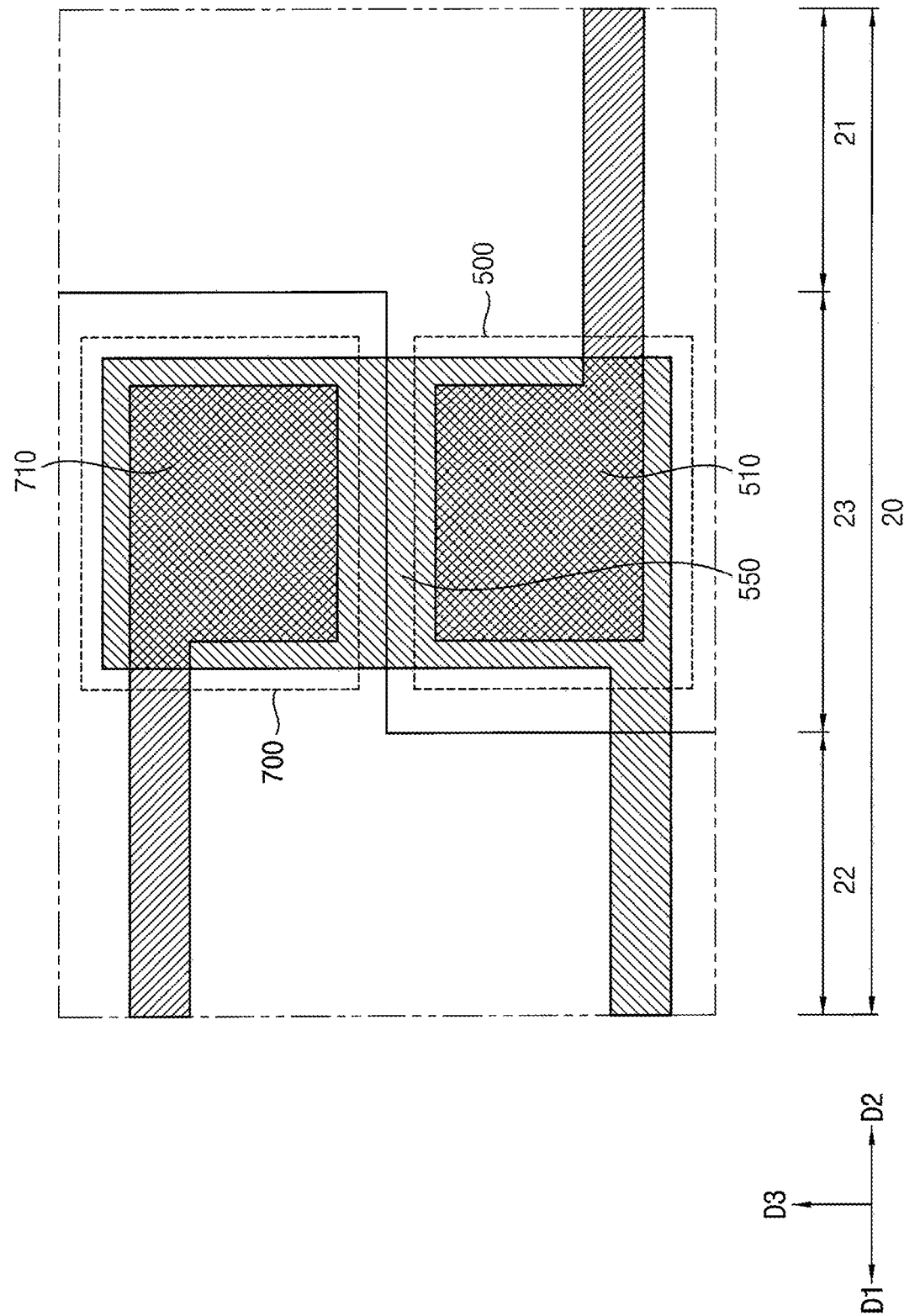

ORGANIC LIGHT EMITTING DIODE DISPLAY DEVICE

CROSS-REFERENCE TO RELATED APPLICATION

This application claims priority to and the benefit of Korean Patent Application No. 10-2019-0140957, filed on Nov. 6, 2019, the entire disclosure of which is hereby incorporated by reference.

BACKGROUND

1. Field

Example embodiments relate generally to an organic light emitting diode display device. More particularly, embodiments of the present disclosure relate to an organic light emitting diode display device including a circuit structure.

2. Description of the Related Art

Flat panel display devices are used as display devices for replacing cathode ray tube display devices due to the light-weight and thin characteristics of flat panel display devices. As representative examples of such flat panel display devices, there are liquid crystal display devices and organic light emitting diode display devices.

The organic light emitting diode display device may include a display area for displaying an image and a peripheral area that is a non-display area (such as dead space). For example, a plurality of pixel structures may be disposed in the display area, and a gate driver, a light emission control driver, and the like, each including a plurality of circuit structures, may be disposed in the peripheral area. The circuit structures may include a plurality of transistors and a plurality of capacitors. Meanwhile, when an organic layer (for example, a planarization layer, a pixel defining layer, and the like) is continuously disposed in the peripheral area, organic material-based residual gas generated during a manufacturing process may penetrate into the display area from the peripheral area through the organic layers, thereby damaging the pixel structures. In order to prevent or reduce this damage to the pixel structures, the organic layer may be discontinuously disposed in the peripheral area. For example, a space (for example, openings of the organic layer) formed by completely removing the organic layer may be present in the peripheral area. When the openings of the organic layer are formed in the peripheral area, the area of the peripheral area may be relatively increased.

SUMMARY

Aspects of some example embodiments are directed toward an organic light emitting diode display device including a circuit structure.

According to some example embodiments, an organic light emitting diode display device includes a substrate, a pixel structure, a first circuit transistor, a first lower electrode, a first upper electrode, and a planarization layer. The substrate has a display area and a peripheral area including a first circuit area, a second circuit area, and a blocking area positioned between the first and second circuit areas. The pixel structure is in the display area on the substrate. The first circuit transistor is in the first circuit area on the substrate. The first lower electrode is in the blocking area on the substrate. The first upper electrode is on the first lower electrode, and the first upper electrode and the first lower electrode constitute a first capacitor. The planarization layer is on the substrate, and has a first opening that overlaps the first capacitor in the blocking area.

In example embodiments, the first capacitor and the first circuit transistor may define a first circuit structure, and the first circuit structure may be in the first circuit area and a first portion of the blocking area.

In example embodiments, the first circuit transistor and the first capacitor may be electrically connected to each other.

In example embodiments, the organic light emitting diode display device may further include a pixel defining layer. The pixel defining layer may be on the planarization layer, and may have a second opening that overlaps the first opening in the blocking area. The first capacitor may overlap the second opening.

In example embodiments, the organic light emitting diode display device may further include a first gate insulating layer between the substrate and the planarization layer, a second gate insulating layer on the first gate insulating layer while covering the first lower electrode, and an insulating interlayer on the second gate insulating layer while covering the first upper electrode.

In example embodiments, the first opening may be configured to expose a top surface of the insulating interlayer positioned in the blocking area, and a width of the first opening may be smaller than a width of the second opening.

In example embodiments, the pixel structure may include a first electrode on the planarization layer, a light emitting layer on the first electrode, and a second electrode on the light emitting layer.

In example embodiments, the second electrode may extend from the display area to the peripheral area to overlap the first and second openings.

In example embodiments, the organic light emitting diode display device may further include a connection electrode on the insulating interlayer in the blocking area, and the connection electrode may come into contact with the second electrode and the insulating interlayer through the first and second openings.

In example embodiments, the organic light emitting diode display device may further include a pixel transistor. The pixel transistor may be between the substrate and the pixel structure, and may be electrically connected to the pixel structure. The pixel transistor may include an active layer in the display area on the substrate, a gate electrode in the display area on the first gate insulating layer, and a source electrode and a drain electrode in the display area on the insulating interlayer.

In example embodiments, the first lower electrode may be positioned on a same layer as the gate electrode.

In example embodiments, the organic light emitting diode display device may further include a storage capacitor spaced apart from the pixel transistor, and the storage capacitor may include a lower gate pattern in the display area on the first gate insulating layer and an upper gate pattern in the display area on the second gate insulating layer and overlapping the lower gate pattern. The first upper electrode may be positioned on a same layer as the upper gate pattern.

In example embodiments, the organic light emitting diode display device may further include a second circuit transistor, a second lower electrode, and a second upper electrode. The second circuit transistor may be in the second circuit area on the substrate. The second lower electrode may be in the blocking area on the substrate and spaced apart from the first lower electrode. The second upper electrode may be on the second lower electrode, and the second upper electrode and the second lower electrode may constitute a second capacitor.

In example embodiments, the second capacitor and the second circuit transistor may define a second circuit structure, and the second circuit structure may be in the second circuit area and a second portion of the blocking area.

In example embodiments, the second circuit transistor and the second capacitor may be electrically connected to each other.

In example embodiments, the first upper electrode may be integrally formed with the second upper electrode.

In example embodiments, the organic light emitting diode display device may further include a first pixel transistor and a second pixel transistor. The second pixel transistor may be between the substrate and the pixel structure and spaced apart from the first pixel transistor, and may be electrically connected to the pixel structure.

In example embodiments, the first circuit structure may be configured to generate a gate signal provided to the first pixel transistor, and the second circuit structure may be configured to generate a light emission control signal provided to the second pixel transistor.

In example embodiments, the peripheral area may be positioned at a side of the display area, and the first circuit area may be adjacent to the display area.

In example embodiments, the organic light emitting diode display device may further include a thin film encapsulation structure on the pixel structure, and the thin film encapsulation structure may include a first inorganic thin film encapsulation layer extending from the display area to the peripheral area, an organic thin film encapsulation layer on the first inorganic thin film encapsulation layer, and a second inorganic thin film encapsulation layer extending from the display area to the peripheral area on the organic thin film encapsulation layer.

In the organic light emitting diode display device according to the example embodiments of the present disclosure, the first circuit structure may be in the first circuit area and the first portion of the blocking area, and the second circuit structure may be in the second circuit area and the second portion of the blocking area. When the first capacitor included in the first circuit structure is in the blocking area, the area of the first circuit area may be relatively decreased. In addition, when the second capacitor included in the second circuit structure is in the blocking area, the area of the second circuit area may be relatively decreased. Accordingly, the organic light emitting diode display device may have a peripheral area having a relatively decreased area, and thus a dead space of the organic light emitting diode display device may be decreased.

BRIEF DESCRIPTION OF THE DRAWINGS

Example embodiments will be understood in more detail from the following description taken in conjunction with the accompanying drawings, in which:

FIG. 1 is a plan view illustrating an organic light emitting diode display device according to example embodiments of the present disclosure;

FIG. 2B is an enlarged plan view illustrating an area 'B' of FIG. 2B;

FIG. 3 is an enlarged plan view illustrating an example of first and second capacitors included in the organic light emitting diode display device;

DETAILED DESCRIPTION

Figure 2A:
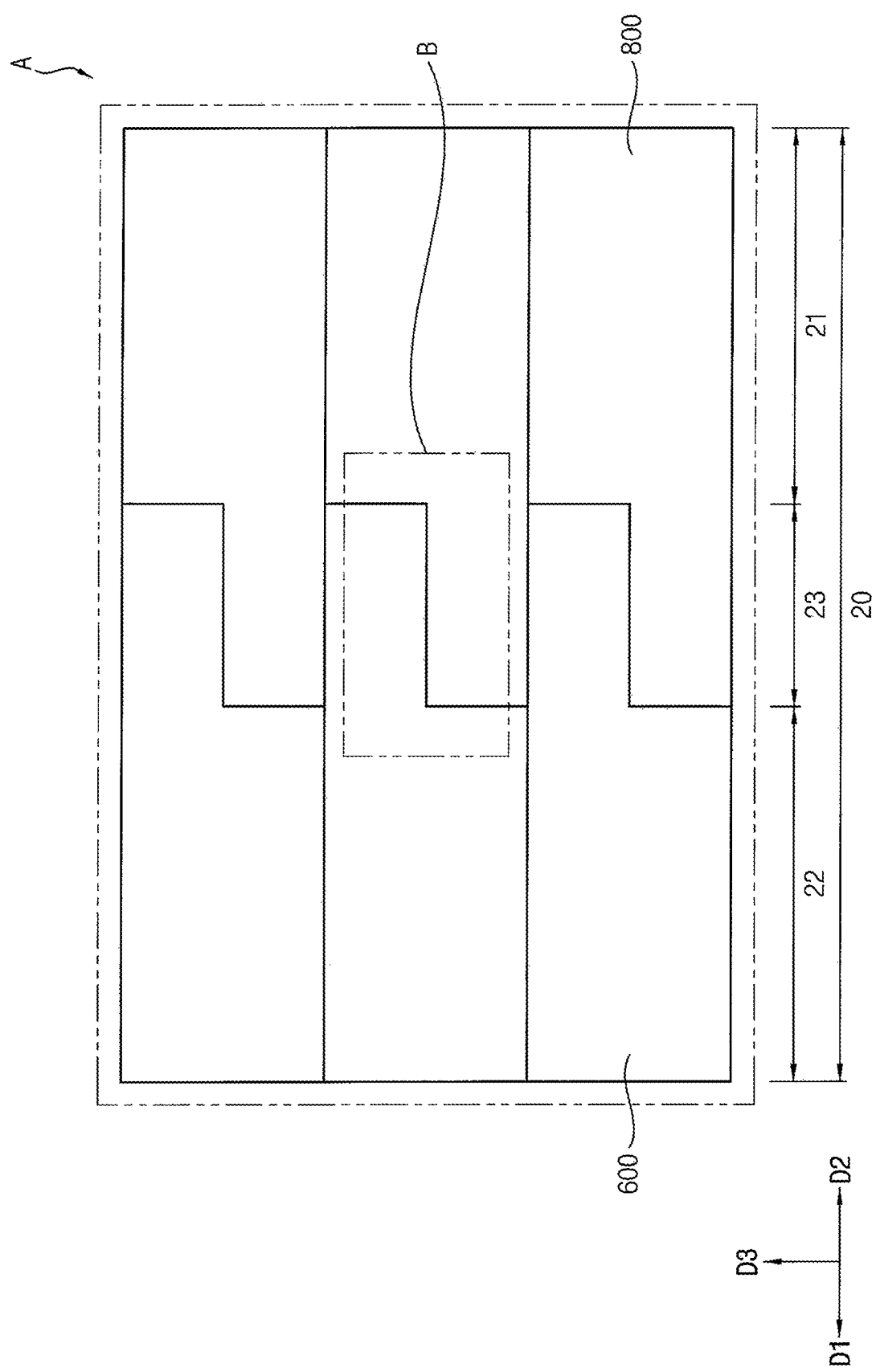
FIG. 2A is an enlarged plan view illustrating an area 'A' of the organic light emitting diode display device of FIG. 1.

Hereinafter, an organic light emitting diode display device and a method of manufacturing an organic light emitting diode display device according to example embodiments of the present disclosure will be described with reference to the accompanying drawings. In the accompanying drawings, same or similar reference numerals refer to the same or similar elements.

As used herein, the use of the term "may," when describing embodiments of the present invention, refers to "one or more embodiments of the present invention." As used herein, the term "and/or" includes any and all combinations of one or more of the associated listed items. As used herein, the term "substantially," "about," "approximately," and similar terms are used as terms of approximation and not as terms of degree, and are intended to account for the inherent deviations in measured or calculated values that would be recognized by those of ordinary skill in the art.

It will be understood that when an element or layer is referred to as being "on", "connected to", "coupled to", or "adjacent to" another element or layer, it can be directly on, connected to, coupled to, or adjacent to the other element or layer, or one or more intervening element(s) or layer(s) may be present. In contrast, when an element or layer is referred to as being "directly on," "directly connected to", "directly coupled to", or "immediately adjacent to" another element or layer, there are no intervening elements or layers present.

Figure 4:
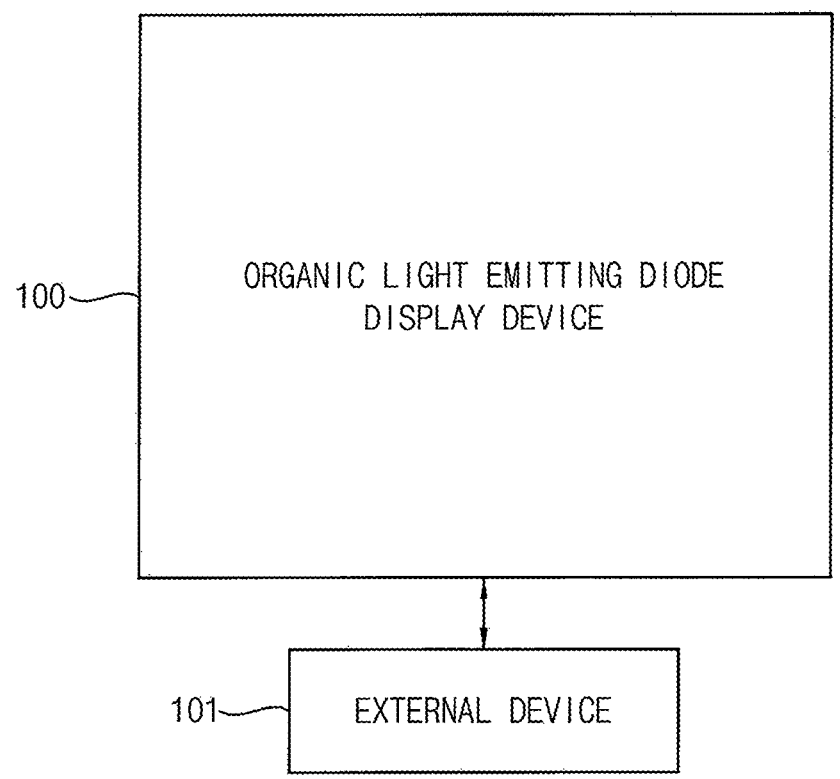
FIG. 4 is a block diagram illustrating an external device electrically connected to the organic light emitting diode display device of FIG. 1.

FIG. 1 is a plan view illustrating an organic light emitting diode display device according to example embodiments of the present disclosure. FIG. 2A is an enlarged plan view illustrating an area 'A' of the organic light emitting diode display device of FIG. 1. FIG. 2B is an enlarged plan view illustrating an area 'B' of FIG. 2A. FIG. 3 is an enlarged plan view illustrating an example of first and second capacitors included in the organic light emitting diode display device. FIG. 4 is a block diagram illustrating an external device electrically connected to the organic light emitting diode display device of FIG. 1.

Referring to FIGS. 1, 2A and 2B, the organic light emitting diode display device 100 may include a gate driver, a light emission signal controller, pad electrodes 470, and the like, and the organic light emitting diode display device 100 may have a display area 10 and a peripheral area 20 positioned at an outer periphery of the display area 10. For example, the peripheral area 20 may substantially surround the display area 10. In addition, the peripheral area 20 may include a first circuit area 21, a second circuit area 22, and a blocking area 23. The blocking area 23 may be positioned between the first circuit area 21 and the second circuit area 22, and the first circuit area 21 may be positioned adjacent to the display area 10.

The display area 10 may include a plurality of pixel areas 30. The pixel areas 30 may be arranged over the whole area of the display area 10 in a matrix form (e.g., matrix pattern). For example, a pixel circuit PIXEL CIRCUIT (PC) shown in FIG. 7 (for example, the first pixel transistor 250 and the second pixel transistor 255 shown in FIG. 8) may be disposed in each of the pixel areas 30, and an organic light emitting diode OLED (for example, the pixel structure 200 shown in FIG. 8) may be disposed on the pixel circuit PC. An image may be displayed in the display area 10 through the pixel circuit PC and the organic light emitting diode OLED.

For example, first, second and third pixel circuits may be disposed in the pixel areas 30. The first pixel circuit may be connected to a first organic light emitting diode that may emit red light, the second pixel circuit may be connected to a second organic light emitting diode that may emit green light, and the third pixel circuit may be connected to a third organic light emitting diode that may emit blue light.

In example embodiments, the first organic light emitting diode may be disposed to overlap the first pixel circuit, the second organic light emitting diode may be disposed to overlap the second pixel circuit, and the third organic light emitting diode may be disposed to overlap the third pixel circuit. In some embodiments, the first organic light emitting diode may be disposed to overlap a part of the first pixel circuit and a part of a pixel circuit different from the first pixel circuit, the second organic light emitting diode may be disposed to overlap a part of the second pixel circuit and a part of a pixel circuit different from the second pixel circuit, and the third organic light emitting diode may be disposed to overlap a part of the third pixel circuit and a part of a pixel circuit different from the third pixel circuit. For example, the first to third organic light emitting diodes may be arrayed using a scheme (e.g., may be arrayed in a pattern) such as an RGB stripe type (e.g., RGB stripe-based pattern) in which rectangles having the same size are sequentially arranged, an S-stripe type (e.g., S-stripe-based pattern) including a blue organic light emitting diode having a relatively large area, a WRGB type (e.g., WRGB-based pattern) further including a white organic light emitting diode, and a PenTile arranged to have an RG-GB repetition pattern.

In addition, at least one driving transistor, at least one switching transistor, at least one capacitor, and the like may be disposed in each of the pixel areas 30. In example embodiments, one driving transistor (for example, the first transistor TR1 of FIG. 7), six switching transistors (for example, the second to seventh transistors TR2, TR3, TR4, TR5, TR6, and TR7 of FIG. 7), and one storage capacitor (for example, the storage capacitor CST of FIG. 7), and the like may be disposed in each of the pixel areas 30.

Although the display area 10, the pixel area 30, and the peripheral area 20 of the present are illustrated in FIG. 1 as having a rectangular shape when viewed from the top, their shapes are not limited thereto. For example, each of the display area 10, the pixel area 30, and the peripheral area 20 may have a triangular plane shape, a rhombus plane shape, a polygonal plane shape, a circular plane shape, a track plane shape, or an oval plane shape. For example, the display area 10, the pixel area 30, and/or the peripheral area 20 may have a triangular shape, a rhombus shape, a polygonal shape, a circular shape, a track shape, or an oval shape when viewed from a plan view.

A plurality of wirings may be disposed in the peripheral area 20. For example, the wirings may include a data signal wiring, a gate signal wiring, a light emission control signal wiring, a gate initialization signal wiring, an initialization voltage wiring, a power supply voltage wiring, and/or the like. The wirings may extend from the peripheral area 20 to (e.g., into) the display area 10 so as to be electrically connected to the pixel circuit PC and/or to the organic light emitting diode OLED.

In addition, a plurality of pad electrodes 470 may be disposed in the peripheral area 20 (for example, in a portion of the peripheral area 20 below the display area 10). As shown in FIG. 4, the external device 101 may be electrically connected to the organic light emitting diode display device 100 through a flexible printed circuit board or a printed circuit board. For example, one side of the flexible printed circuit board may come into contact (e.g., direct contact) with the pad electrodes 470, and the other side of the flexible printed circuit board may come into contact (e.g., direct contact) with the external device 101. The external device 101 may generate a data signal, a gate signal, a light emission control signal, a gate initialization signal, an initialization voltage, a power supply voltage, and/or the like, and the data signal, the gate signal, the light emission 186938/411598 control signal, the gate initialization signal, the initialization voltage, the power supply voltage, and/or the like may be provided to the pixel circuit PC and/or to the organic light emitting diode OLED through the pad electrodes 470 and the flexible printed circuit board. In addition, a drive integrated circuit may be mounted on the flexible printed circuit board. In other example embodiments, the drive integrated circuit may be mounted on the organic light emitting diode display device 100 so as to be adjacent to the pad electrodes 470.

In addition, the gate driver and the light emission control driver may be disposed in a part of the peripheral area 20 (for example, in a portion of the peripheral area 20 at a left side of the display area 10). For example, the gate driver may be positioned closer to the display area 10 than the light emission control driver. In other example embodiments, the gate driver and the light emission control driver may be disposed on a right side or an upper portion (e.g., top side) of the display area 10 (e.g., in a portion of the peripheral area 20 at a right side or a top side of the display area 10), and the light emission control driver may be positioned closer to the display area 10 than the gate driver.

In example embodiments, the gate driver may be disposed in parts of the first circuit area 21 and the blocking area 23 included in the peripheral area 20, and the light emission control driver may be disposed in parts of the second circuit area 22 and the blocking area 23 included in the peripheral area 20.

The gate driver may include a plurality of first circuit structures 800, and the light emission control driver may include a plurality of second circuit structures 600. The gate driver may receive the gate signal from the external device 101, and the gate signal may be provided to the pixel circuit PC through the first circuit structures 800 of the gate driver. In addition, the light emission control driver may receive the light emission control signal from the external device 101, and the light emission control signal may be provided to the pixel circuit PC through the second circuit structures 600.

Referring back to FIGS. 2A and 2B, the first circuit structure 800 may be disposed in the first circuit area 21 and in a first portion of the blocking area 23. The first circuit structure 800 may include at least one circuit transistor and at least one capacitor. For example, the first circuit structure 800 may have a circuit structure including the first to eighth transistors M1, M2, M3, M4, M5, M6, M7, and M8 and the first and second capacitors C1 and C2 shown in FIG. 5. However, the circuit configuration of the first circuit structure 800 of the present disclosure is not limited thereto. The first circuit structure 800 may include various suitable circuit components for generating a gate signal.

Figure 5:
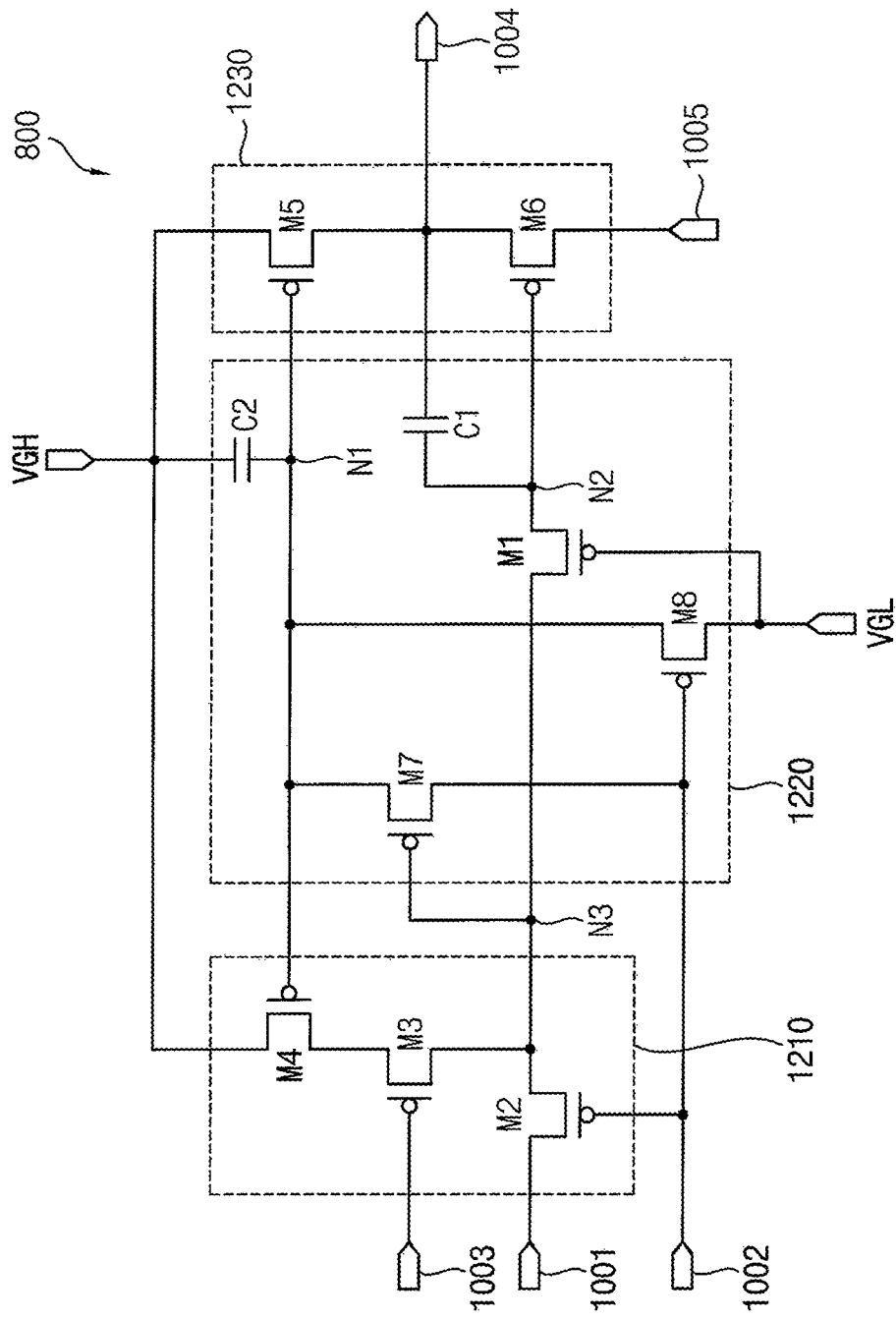
FIG. 5 is a circuit diagram illustrating a first circuit structure of FIG. 2A.

In example embodiments, the first capacitor C1 and/or the second capacitor C2 of FIG. 5 may be disposed in the blocking area 23. In some embodiments, the first to eighth transistors M1, M2, M3, M4, M5, M6, M7, and M8 of FIG. 5 may be disposed in the first circuit area 21, and the first capacitor C1 and/or the second capacitor C2 of FIG. 5 may be disposed in the first portion of the blocking area 23. The first to eighth transistors M1, M2, M3, M4, M5, M6, M7, and M8 of FIG. 5 may be defined as first circuit transistors (for example, one of the first to eighth transistors M1, M2, M3, M4, M5, M6, M7, and M8 may be defined as the first circuit transistor 850 of FIG. 9), and the first capacitor C1 or the second capacitor C2 of FIG. 5 may be defined as a first capacitor 500 in FIG. 2B. The first circuit transistor may be disposed in the first circuit area 21, and the first capacitor 500 may be disposed in the blocking area 23 (e.g., in the first portion of the blocking area 23). In some embodiments, the first capacitor 500 may be electrically connected to the first circuit transistor, and the first capacitor 500 may be connected (e.g., directly connected) to some of the first to eighth transistors M1, M2, M3, M4, M5, M6, M7, and M8 of FIG. 5. As shown in FIG. 2B, the first capacitor 500 may include a first lower electrode 510 and a first upper electrode 520 disposed on the first lower electrode 510. The first lower electrode 510 may extend in a first direction D1, which is a direction from the first circuit area 21 to the blocking area 23, to be disposed in the blocking area 23. For example, in some embodiments, the first lower electrode 510 may extend from the first circuit area 21 in the first direction D1 to be disposed in the blocking area 23. The first upper electrode 520 may extend from the second circuit area 22 in a second direction D2 (e.g., a direction from the second circuit area 22 to the blocking area 23) to overlap the first lower electrode 510 in the blocking area 23. For example, a first driving power supply VGH may be provided to the first upper electrode 520, and a first driving power supply VGH wiring is disposed in the second circuit area 22, so that the first upper electrode 520 may extend from the second circuit area 22. In other example embodiments, when the first driving power supply VGH wiring is disposed in the second circuit area 22, the first upper electrode 520 may extend from the first circuit area 21 in the first direction D1.

Figure 6:
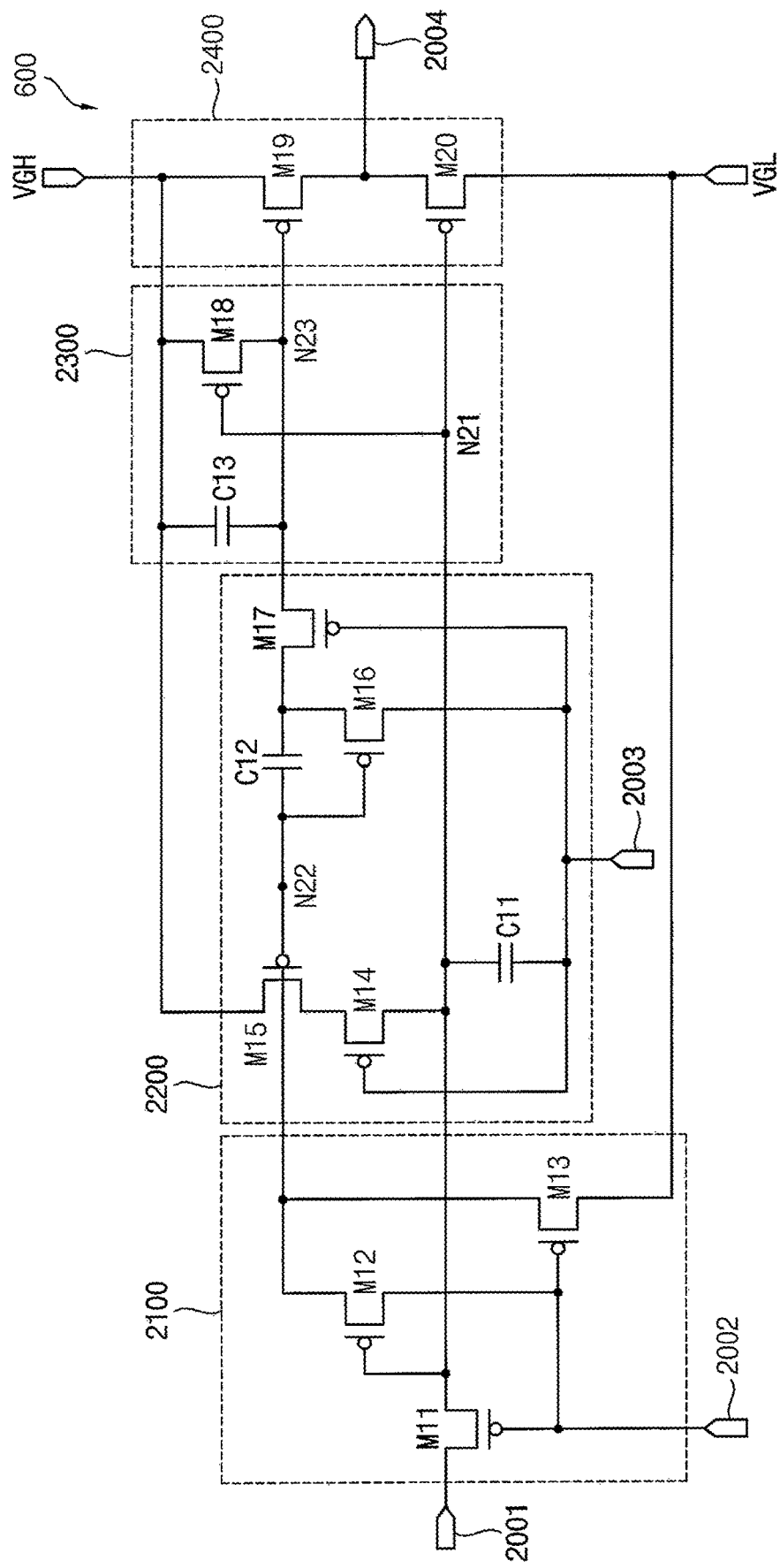
FIG. 6 is a circuit diagram illustrating a second circuit structure of FIG. 2A.

In addition, the second circuit structure 600 may be disposed in the second circuit area 22 and in a second portion of the blocking area 23. The second circuit structure 600 may include at least one circuit transistor and at least one capacitor. For example, the second circuit structure 600 may have a circuit structure that is shown in FIG. 6 and may include eleventh to twentieth transistors M11, M12, M13, M14, M15, M16, M17, M18, M19, and M20, and eleventh to thirteenth capacitors C11, C12 and C13. However, the configuration of the second circuit structure 600 of the present disclosure is not limited thereto. The second circuit structure 600 may include various suitable circuit components for generating a light emission control signal.

In exemplary embodiments, the eleventh capacitor C11, the twelfth capacitor C12, and/or the thirteenth capacitor C13 of FIG. 6 may be disposed in the blocking area 23 (e.g., in the second portion of the blocking area 23). In some embodiments, the eleventh to twentieth transistors M11, M12, M13, M14, M15, M16, M17, M18, M19, and M20 of FIG. 6 may be disposed in the second circuit area 22, and the eleventh capacitor C11, the twelfth capacitor C12, and/or the thirteenth capacitor C13 of FIG. 6 may be disposed in the second portion of the blocking area 23. The eleventh through twentieth transistors M11, M12, M13, M14, M15, M16, M17, M18, M19, and M20 of FIG. 6 may be defined as second circuit transistors (for example, one of the eleventh to twentieth transistors M11, M12, M13, M14, M15, M16, M17, M18, M19, and M20 may be defined as the second circuit transistor 650 of FIG. 9); the eleventh capacitor C11, the twelfth capacitor C12, and/or the thirteenth capacitor C13 of FIG. 6 may be defined as a second capacitor 700 in FIG. 2B; and the second capacitor 700 may be spaced apart from the first capacitor 500 in the blocking area 23. For example, the second capacitor 700 may be in the second portion of the blocking area 23, and the first capacitor 500 may be in the first portion of the blocking area 23. In some embodiments, the second capacitor 700 may be electrically connected to the second circuit transistor, and may be connected (e.g., directly connected) to some of the eleventh to twentieth transistors M11, M12, M13, M14, M15, M16, M17, M18, M19, and M20 of FIG. 6. As shown in FIG. 2B, the second capacitor 700 may include a second lower electrode 710 and a second upper electrode 720 disposed on the second lower electrode 710. The second lower electrode 710 may extend from the second circuit area 22 in the second direction D2 so as to be spaced apart from the first lower electrode 510 in the blocking area 23. The second upper electrode 720 may extend from the second circuit area 22 in the second direction D2 to overlap the second lower electrode 710 in the blocking area 23, and the second upper electrode 720 may be spaced apart from the first upper electrode 520. For example, a first driving power supply VGH may be provided to the second upper electrode 720, and a first driving power supply VGH wiring is disposed in the second circuit area 22 so that the second upper electrode 720 may extend from the second circuit area 22. In other example embodiments, when the first driving power supply VGH wiring is disposed in the first circuit area 21, the second upper electrode 720 may extend from the first circuit area 21 in the first direction D1.

In other example embodiments, as shown in FIG. 3, an upper electrode 550 may be disposed on the first lower electrode 510 and on the second lower electrode 710. The upper electrode 550 may extend from the second circuit area 22 in the second direction D2 to overlap the first lower electrode 510 and the second lower electrode 710. In some embodiments, the upper electrode 550 may have a shape in which the first upper electrode 520 and the second upper electrode 720 of FIG. 2B are integrally formed with each other.

According to the organic light emitting diode display device of the related art, the gate driver may be disposed only in the first circuit area 21, and the light emission signal controller may be disposed only in the second circuit area 22. Meanwhile, an organic layer may be discontinuously disposed in the blocking area 23 to prevent or block organic material-based residual gas, which is generated in the manufacturing process of the organic light emitting diode display device of the related art, from penetrating into the display area 10 from the peripheral area 20 through the organic layer (for example, a planarization layer 270 and a pixel defining layer 310 of FIGS. 8 and 9) and thus causing damage to a pixel (for example, the pixel structure 200 of FIG. 8). In other words, a space (for example, openings of the organic layer) formed by completely removing the organic layer may be present in the blocking area 23. When the openings of the organic layer are formed in the blocking area 23, the area of the peripheral area 20 may be relatively increased.

In the organic light emitting diode display device 100 according to the example embodiments of the present disclosure, the first circuit structure 800 may be disposed in the first circuit area 21 and the first portion of the blocking area 23, and the second circuit structure 600 may be disposed in the second circuit area 22 and the second portion of the blocking area 23. When the first capacitor 500 included in the first circuit structure 800 is disposed in the blocking area 23, the area of the first circuit area 21 may be relatively decreased (e.g., compared to if the first capacitor 500 was disposed in the first circuit area 21). In addition, when the second capacitor 700 included in the second circuit structure 600 is disposed in the blocking area 23, the area of the second circuit area 22 may be relatively decreased (e.g., compared to if the second capacitor 700 was disposed in the second circuit area 22). Accordingly, the organic light emitting diode display device 100 may have a peripheral area 20 having a relatively decreased area, and thus a dead space of the organic light emitting diode display device 100 may be decreased.

Although FIG. 2A shows that one first circuit structure 800 and one second circuit structure 600 correspond in the first direction D1, the configuration of the present disclosure is not limited thereto. For example, depending on the size or circuit design of each of the first and second circuit structures 800 and 600, one second circuit structure 600 may be disposed to correspond to at least two first circuit structures 800 in the first direction D1, or one first circuit structure 800 may be disposed to correspond to at least two second circuit structures 600 in the first direction D1. In this case, at least three capacitors may be disposed in FIG. 2B.

FIG. 5 is a circuit diagram illustrating the first circuit structure of FIG. 2A.

Referring to FIG. 5, the first circuit structure 800 may include a first driver 1210, a second driver 1220, an output unit 1230, and a first transistor M1.

The output unit 1230 may include a fifth transistor M5 and a sixth transistor M6. The output unit 1230 may control a voltage supplied to an output terminal 1004 based on voltages of a first node N1 and a second node N2. The fifth transistor M5 may be connected between the first driving power supply VGH wiring (for example, a high power voltage wiring) and the output terminal 1004, and a gate electrode of the fifth transistor M5 may be connected to the first node N1. The fifth transistor M5 may control a connection between the first driving power supply VGH wiring and the output terminal 1004 based on the voltage applied to the first node N1. The sixth transistor M6 may be connected between the output terminal 1004 and a fourth input terminal 1005, and a gate electrode of the sixth transistor M6 may be connected to the second node N2. The sixth transistor M6 may control a connection between the output terminal 1004 and the fourth input terminal 1005 based on the voltage applied to the first node N1. The output unit 1230 may be driven as a buffer. In some embodiments, the fifth transistor M5 and/or the sixth transistor M6 may have a configuration in which a plurality of transistors are connected in parallel.

The first driver 1210 may include a second transistor M2, a third transistor M3, and a fourth transistor M4. The first driver 1210 may control a voltage of the third node N3 based on clock signals supplied to a first input terminal 1001, a second input terminal 1002, and a third input terminal 1003. The second transistor M2 may be connected between the first input terminal 1001 and the third node N3, and a gate electrode of the second transistor M2 may be connected to the second input terminal 1002. The second transistor M2 may control a connection between the first input terminal 1001 and the third node N3 based on a clock signal supplied to the second input terminal 1002. The third transistor M3 and the fourth transistor M4 may be connected in series between the third node N3 and the first driving power supply VGH wiring. The third transistor M3 may be connected between the fourth transistor M4 and the third node N3, and a gate electrode of the third transistor M3 may be connected to the third input terminal 1003. The third transistor M3 may control a connection between the fourth transistor M4 and the third node N3 based on a clock signal supplied to the third input terminal 1003. The fourth transistor M4 may be connected between the third transistor M3 and the first driving power supply VGH wiring, and a gate electrode of the fourth transistor M4 may be connected to the first node N1. The fourth transistor M4 may control a connection between the third transistor M3 and the first driving power supply VGH wiring based on the voltage of the first node N1.

The second driver 1220 may include a seventh transistor M7, an eighth transistor M8, a first capacitor C1, and a second capacitor C2. The second driver 1220 may control the voltage of the first node N1 based on the voltages of the second input terminal 1002 and the third node N3. The first capacitor C1 may be connected between the second node N2 and the output terminal 1004. The first capacitor C1 may charge a voltage based on turning-on and turning-off of the sixth transistor M6. The second capacitor C2 may be connected between the first node N1 and the first driving power supply VGH wiring. The second capacitor C2 may charge a voltage applied to the first node N1. The seventh transistor M7 may be connected between the first node N1 and the second input terminal 1002, and a gate electrode of the seventh transistor M7 may be connected to the third node N3. The seventh transistor M7 may control a connection between the first node N1 and the second input terminal 1002 based on the voltage of the third node N3. The eighth transistor M8 may be connected between the first node N1 and a second driving power supply VGL wiring (for example, a low power voltage wiring), and a gate electrode of the eighth transistor M8 may be connected to the second input terminal 1002. The eighth transistor M8 may control a connection between the first node N1 and the second driving power supply VGL wiring based on a clock signal of the second input terminal 1002. The first transistor M1 may be connected between the third node N3 and the second node N2, and a gate electrode of the first transistor M1 may be connected to the second driving power supply VGL wiring. The first transistor M1 may maintain an electrical connection between the third node N3 and the second node N2 while maintaining a turning-on state. In some embodiments, the first transistor M1 may limit a drop width of the voltage of the third node N3 based on the voltage of the second node N2. In some embodiments, even when the voltage of the second node N2 drops to a voltage lower than the second driving power supply VGL, the voltage of the third node N3 may not be lower than a voltage obtained by subtracting a threshold voltage of the first transistor M1 from the second driving power supply VGL.

Accordingly, the first circuit structure 800 may output a gate signal (for example, the gate signal GW of FIG. 7) to the output terminal 1004.

As described above, in example embodiments, the first to eighth transistors M1, M2, M3, M4, M5, M6, M7, and M8 may be disposed in the first circuit area 21, and the first capacitor C1 and/or the second capacitor C2 may be disposed in the first portion of the blocking area 23.

Although the first circuit structure 800 has been described as including eight transistors and two capacitors, the configuration of the first circuit structure 800 of the present disclosure is not limited thereto. For example, the first circuit structure 800 may be configured to have at least one transistor and at least one capacitor.

FIG. 6 is a circuit diagram illustrating a second circuit structure of FIG. 2A.

Referring to FIG. 6, the second circuit structure 600 may include a first signal processor 2100, a second signal processor 2200, a third signal processor 2300, and an output unit 2400.

The first signal processor 2100 may include an eleventh transistor M11, a twelfth transistor M12, and a thirteenth transistor M13. The first signal processor 2100 may control voltages of a twenty-second node N22 and a twenty-first node N21 based on signals supplied to a first input terminal 2001 and a second input terminal 2002. The eleventh transistor M11 may be connected between the first input terminal 2001 and the twenty-first node N21, and a gate electrode of the eleventh transistor M11 may be connected to the second input terminal 2002. The eleventh transistor M11 may be turned on when a clock signal is supplied to the second input terminal 2002. The twelfth transistor M12 may be connected between the second input terminal 2002 and the twenty-second node N22, and a gate electrode of the twelfth transistor M12 may be connected to the twenty-first node N21. The twelfth transistor M12 may be turned on or turned off based on the voltage of the twenty-first node N21. The thirteenth transistor M13 may be connected between the second driving power supply VGL wiring and the twenty-second node N22, and a gate electrode of the thirteenth transistor M13 may be connected to the second input terminal 2002. The thirteenth transistor M13 may be turned on when the clock signal is supplied to the second input terminal 2002.

The second signal processor 2200 may include a fourteenth transistor M14, a fifteenth transistor M15, a sixteenth transistor M16, a seventeenth transistor M17, an eleventh capacitor C11, and a twelfth capacitor C12. The second signal processor 2200 may control voltages of the twenty-first node N21 and a twenty-third node N23 based on a clock signal supplied to a third input terminal 2003 and the voltage of the twenty-second node N22. The fourteenth transistor M14 may be connected between the fifteenth transistor M15 and the twenty-first node N21, and a gate electrode of the fourteenth transistor M14 may be connected to the third input terminal 2003. The fourteenth transistor M14 may be turned on when the clock signal is supplied to the third input terminal 2003. The fifteenth transistor M15 may be connected between the first driving power supply VGH wiring and the fourteenth transistor M14, and a gate electrode of the fifteenth transistor M15 may be connected to the twenty-second node N22. The fifteenth transistor M15 may be turned on or turned off based on the voltage of the twenty-second node N22. The sixteenth transistor M16 may be connected between a first electrode of the seventeenth transistor M17 and the third input terminal 2003, and a gate electrode of the sixteenth transistor M16 may be connected to the twenty-second node N22. The sixteenth transistor M16 may be turned on or turned off based on the voltage of the twenty-second node N22. The seventeenth transistor M17 may be connected between a first electrode of the sixteenth transistor M16 and the twenty-third node N23, and a gate electrode of the seventeenth transistor M17 may be connected to the third input terminal 2003. The seventeenth transistor M17 may be turned on when the clock signal is supplied to the third input terminal 2003. The eleventh capacitor C11 may be connected between the twenty-first node N21 and the third input terminal 2003. The twelfth capacitor C12 may be connected between the twenty-second node N22 and the first electrode of the seventeenth transistor M17.

The third signal processor 2300 may include an eighteenth transistor M18 and a thirteenth capacitor C13. The third signal processor 2300 may control the voltage of the twenty-third node N23 based on the voltage of the twenty-first node N21. The eighteenth transistor M18 may be connected between the first driving power supply VGH wiring and the twenty-third node N23, and a gate electrode of the eighteenth transistor M18 may be connected to the twenty-first node N21. The eighteenth transistor M18 may be turned on or turned off based on the voltage of the twenty-first node N21. The thirteenth capacitor C13 may be connected between the first driving power supply VGH wiring and the twenty-third node N23.

The output unit 2400 may include a nineteenth transistor M19 and a twentieth transistor M20. The output unit 2400 may control the voltage supplied to the output terminal 2004 based on the voltages of the twenty-first node N21 and the twenty-third node N23. The nineteenth transistor M19 may be connected between the first driving power supply VGH wiring and the output terminal 2004, and a gate electrode of the nineteenth transistor M19 may be connected to the twenty-third node N23. The nineteenth transistor M19 may be turned on or turned off based on the voltage of the twenty-third node N23. The twentieth transistor M20 may be connected between the output terminal 2004 and the second driving power supply VGL wiring, and a gate electrode of the twentieth transistor M20 may be connected to the twenty-first node N21. The twentieth transistor M20 may be turned on or turned off based on the voltage of the twenty-first node N21. The output unit 2400 may be driven as a buffer. In some embodiments, the nineteenth transistor M19 and/or the twentieth transistor M20 may have a configuration in which a plurality of transistors are connected in parallel. For example, in some embodiments, each of the nineteenth transistor M19 and the twentieth transistor M20 may be provided as a plurality of transistors connected in parallel.

Accordingly, the second circuit structure 600 may output a light emission control signal (for example, the light emission control signal EM of FIG. 7) to the output terminal 2004.

As described above, in example embodiments, the eleventh to twentieth transistors M11, M12, M13, M14, M15, M16, M17, M18, M19, and M20 may be disposed in the second circuit area 22, and the eleventh capacitor C11, the twelfth capacitor C12, and/or the thirteenth capacitor C13 may be disposed in the second portion of the blocking area 23.

Although the second circuit structure 600 has been described as including ten transistors and three capacitors, the configuration of the second circuit structure 600 of the present disclosure is not limited thereto. For example, the second circuit structure 600 may be configured to have at least one transistor and at least one capacitor.

Figure 7:
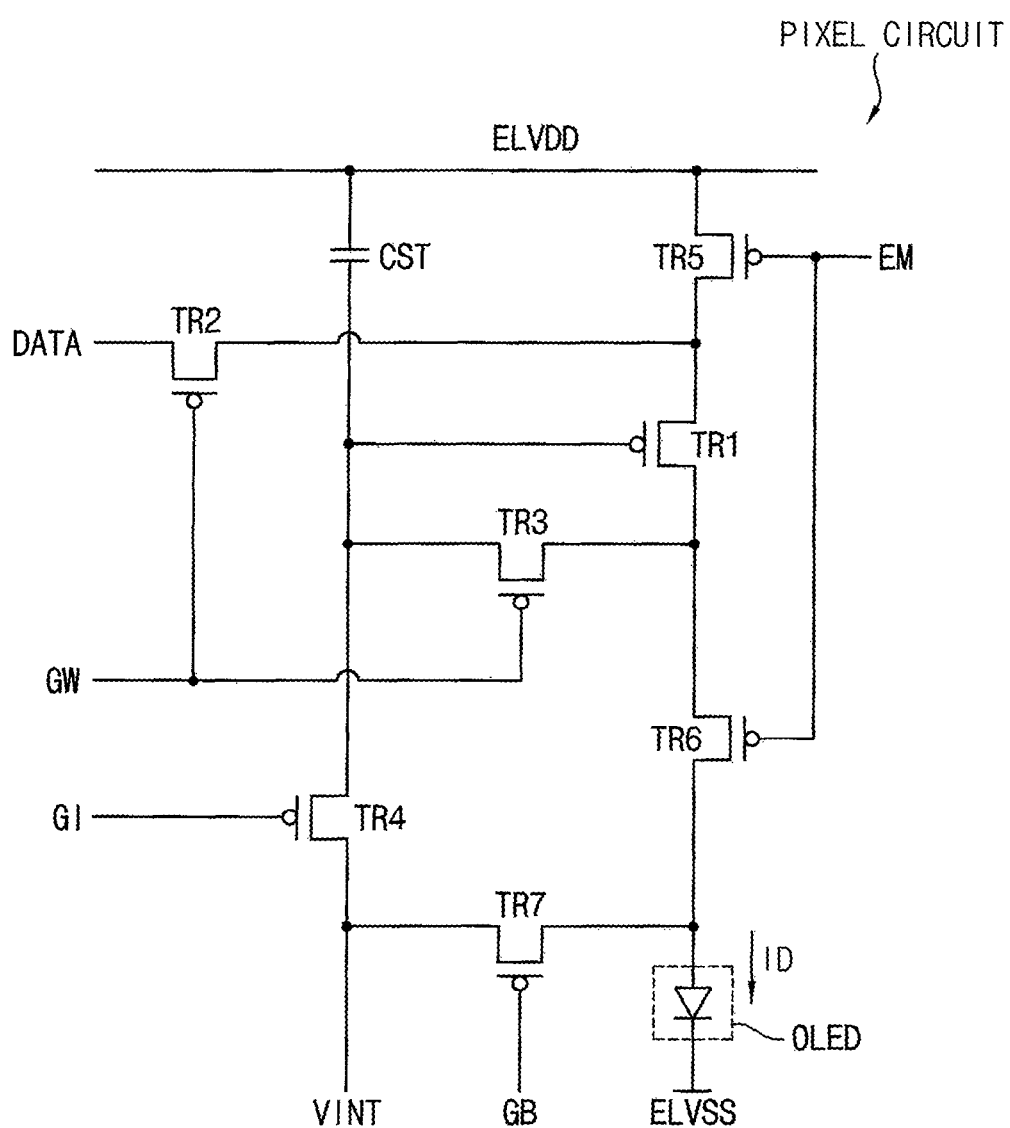
FIG. 7 is a circuit diagram illustrating a pixel circuit and an organic light emitting diode disposed in a pixel area of FIG. 1.

FIG. 7 is a circuit diagram illustrating a pixel circuit and an organic light emitting diode disposed in the pixel area of FIG. 1.

Referring to FIG. 7, a pixel circuit PIXEL CIRCUIT (PC) and an organic light emitting diode OLED may be disposed in each of the pixel areas 30 of the organic light emitting diode display device 100, in which one pixel circuit PC may include an organic light emitting diode OLED (for example, the pixel structure 200 of FIG. 8), first to seventh transistors TR1, TR2, TR3, TR4, TR5, TR6, and TR7, a storage capacitor CST (for example, the storage capacitor 180 of FIG. 8), a high power supply voltage ELVDD wiring, a low power supply voltage ELVSS wiring, an initialization voltage VINT wiring, a data signal DATA wiring, a gate signal GW wiring, a gate initialization signal GI wiring, a light emission control signal EM wiring, a diode initialization signal GB wiring, and the like. The first transistor TR1 may correspond to a driving transistor, and each of the second to seventh transistors TR2, TR3, TR4, TR5, TR6, and TR7 may correspond to a switching transistor. Each of the first to seventh transistors TR1, TR2, TR3, TR4, TR5, TR6, and TR7 may include a first terminal, a second terminal, a channel, and a gate terminal. In example embodiments, the first terminal may be a source terminal and the second terminal may be a drain terminal. In some embodiments, the first terminal may be a drain terminal, and the second terminal may be a source terminal.

The organic light emitting diode OLED may output light based on a driving current ID. The organic light emitting diode OLED may include a first terminal and a second terminal. In example embodiments, the second terminal of the organic light emitting diode OLED may be supplied with a low power supply voltage ELVSS, and the first terminal of the organic light emitting diode OLED may be supplied with a high power supply voltage ELVDD. For example, the first terminal of the organic light emitting diode OLED may be an anode terminal, and the second terminal of the organic light emitting diode OLED may be a cathode terminal. In some embodiments, the first terminal of the organic light emitting diode OLED may be a cathode terminal, and the second terminal of the organic light emitting diode OLED may be an anode terminal. In example embodiments, the anode terminal of the organic light emitting diode OLED may correspond to the first electrode 290 of FIG. 8, and the cathode terminal of the organic light emitting diode OLED may correspond to the second electrode 340 of FIGS. 8 and 9.

The first transistor TR1 may generate the driving current ID. In example embodiments, the first transistor TR1 may operate in a saturation area. In this case, the first transistor TR1 may generate the driving current ID based on a voltage difference between the gate terminal and the source terminal. In addition, a tone wedge (or a grayscale level) may be expressed based on a size of the driving current ID supplied to the organic light emitting diode OLED. In some embodiments, the first transistor TR1 may operate in a linear area. In this case, a tone wedge (or a grayscale level) may be expressed based on the sum of times for supplying the driving current to the organic light emitting diode OLED within one frame.

The gate terminal of the second transistor TR2 may be supplied with the gate signal GW. For example, the gate signal GW may be provided from the first circuit structure 800 of FIG. 2A included in the gate driver, and the gate signal GW may be applied to the gate terminal of the second transistor TR2 through the gate signal GW wiring. The first terminal of the second transistor TR2 may be supplied with the data signal DATA. The second terminal of the second transistor TR2 may be connected to the first terminal of the first transistor TR1. For example, the gate signal GW may be provided from a gate driving unit, and the gate signal GW may be applied to the gate terminal of the second transistor TR2 through the gate signal GW wiring. The second transistor TR2 may supply the data signal DATA to the first terminal of the first transistor TR1 during an activation period of the gate signal GW (e.g., a period of time when the gate signal GW is applied to the gate signal GW wiring). In this case, the second transistor TR2 may operate in the linear area.

The gate terminal of the third transistor TR3 (for example, the first pixel transistor 250 of FIG. 8) may receive a gate signal GW. For example, the gate signal GW may be provided from the first circuit structure 800 of FIG. 2A included in the gate driver, and the gate signal GW may be applied to the gate terminal of the third transistor TR3 through the gate signal GW wiring. The first terminal of the third transistor TR3 may be connected to the gate terminal of the first transistor TR1. The second terminal of the third transistor TR3 may be connected to the second terminal of the first transistor TR1. The third transistor TR3 may connect the gate terminal of the first transistor TR1 to the second terminal of the first transistor TR1, during the activation period of the gate signal GW. In this case, the third transistor TR3 may operate in the linear area. Thus, the third transistor TR3 may diode-connect the first transistor TR1 during the activation period of the gate signal GW.

An input terminal of the initialization voltage VINT wiring provided with the initialization voltage VINT may be connected to the first terminal of the fourth transistor TR4 and the first terminal of the seventh transistor TR7, and an output terminal of the initialization voltage VINT wiring may be connected to the second terminal of the fourth transistor TR4 and the first terminal of the storage capacitor CST.

The gate terminal of the fourth transistor TR4 may be supplied with the gate initialization signal GI. The first terminal of the fourth transistor TR4 may be supplied with the initialization voltage VINT. The second terminal of the fourth transistor TR4 may be connected to the gate terminal of the first transistor TR1.

The fourth transistor TR4 may supply the initialization voltage VINT to the gate terminal of the first transistor TR1 during an activation period of the gate initialization signal GI (e.g., a period of time when the gate initialization signal GI is applied to the gate initialization signal GI wiring). In this case, the fourth transistor TR4 may operate in the linear area. Thus, the fourth transistor TR4 may initialize the gate terminal of the first transistor TR1 into the initialization voltage VINT during the activation period of the gate initialization signal GI. In example embodiments, the initialization voltage VINT may have a voltage level sufficiently lower than a voltage level of the data signal DATA maintained by the storage capacitor CST in a previous frame, and the initialization voltage VINT may be supplied to the gate terminal of the first transistor TR1. In other example embodiments, the initialization voltage may have a voltage level sufficiently higher than the voltage level of the data signal maintained by the storage capacitor in the previous frame, and the initialization voltage may be supplied to the gate terminal of the first transistor.

The gate terminal of the fifth transistor TR5 may be supplied with a light emission control signal EM. For example, the light emission control signal EM may be provided from the second circuit structure 600 of FIG. 2A included in the light emission control driver, and the light emission control signal EM may be applied to the gate terminal of the fifth transistor TR5 through the light emission control signal EM wiring. The first terminal of the fifth transistor TR5 may be connected to the high power supply voltage ELVDD wiring. The second terminal of the fifth transistor TR5 may be connected to the first terminal of the first transistor TR1. The fifth transistor TR5 may supply the high power supply voltage ELVDD to the first terminal of the first transistor TR1 during an activation period of the light emission control signal EM (e.g., a period of time when the light emission control signal EM is applied to the light emission control signal EM wiring). The fifth transistor TR5 may block the supply of the high power supply voltage ELVDD during an inactivation period of the light emission control signal EM (e.g., a period of time when the light emission control signal EM is not applied to the light emission control signal EM wiring). In this case, the fifth transistor TR5 may operate in the linear area. The fifth transistor TR5 may supply the high power supply voltage ELVDD to the first terminal of the first transistor TR1 during the activation period of the light emission control signal EM, so that the first transistor TR1 may generate the driving current ID. In addition, the fifth transistor TR5 may block the supply of the high power supply voltage ELVDD during the inactivation period of the light emission control signal EM, so that the data signal DATA supplied to the first terminal of the first transistor TR1 may be supplied to the gate terminal of the first transistor TR1.

The gate terminal of the sixth transistor TR6 (for example, the second pixel transistor 255 of FIG. 8) may receive the light emission control signal EM. For example, the light emission control signal EM may be provided from the second circuit structure 600 of FIG. 2A included in the light emission control driver, and the light emission control signal EM may be applied to the gate terminal of the sixth transistor TR6 through the light emission control signal EM wiring. The first terminal of the sixth transistor TR6 may be connected to the second terminal of the first transistor TR1. The second terminal of the sixth transistor TR6 may be connected to the first terminal of the organic light emitting diode OLED. The sixth transistor TR6 may supply the driving current ID generated by the first transistor TR1 to the organic light emitting diode OLED during the activation period of the light emission control signal EM. In this case, the sixth transistor TR6 may operate in the linear area. In some embodiments, the sixth transistor TR6 may supply the driving current ID generated by the first transistor TR1 to the organic light emitting diode OLED during the activation period of the light emission control signal EM, so that the organic light emitting diode OLED may output light. In addition, the sixth transistor TR6 electrically isolates the first transistor TR1 and the organic light emitting diode OLED from each other during the inactivation period of the light emission control signal EM, so that the data signal DATA supplied to the second terminal of the first transistor TR1 (more precisely, the data signal compensated for the threshold voltage) may be supplied to the gate terminal of the first transistor TR1.

The gate terminal of the seventh transistor TR7 may be supplied with a diode initialization signal GB. The first terminal of the seventh transistor TR7 may be supplied with the initialization voltage VINT. The second terminal of the seventh transistor TR7 may be connected to the first terminal of the organic light emitting diode OLED. The seventh transistor TR7 may supply the initialization voltage VINT to the first terminal of the organic light emitting diode OLED during an activation period of the diode initialization signal GB (e.g., a period of time when the diode initialization signal GB is applied to the diode initialization signal GB wiring). In this case, the seventh transistor TR7 may operate in the linear area. In some embodiments, the seventh transistor TR7 may initialize the first terminal of the organic light emitting diode OLED into the initialization voltage VINT during activation period of the diode initialization signal GB.

The storage capacitor CST (for example, the storage capacitor 180 of FIG. 8) may include a first terminal and a second terminal. The storage capacitor CST may be connected between the high power supply voltage ELVDD wiring and the gate terminal of the first transistor TR1. For example, the first terminal of the storage capacitor CST may be connected to the gate terminal of the first transistor TR1, and the second terminal of the storage capacitor CST may be connected to the high power supply voltage ELVDD wiring. The storage capacitor CST may maintain a voltage level of the gate terminal of the first transistor TR1 during an inactivation period of the gate signal GW (e.g., a period of time when the gate signal GW is not applied to the gate signal GW wiring). The inactivation period of the gate signal GW may include (e.g., may overlap in time with) the activation period of the light emission control signal EM, and a driving current ID generated by the first transistor TR1 during the activation period of the light emission control signal EM may be supplied to the organic light emitting diode OLED. Accordingly, the driving current ID generated by the first transistor TR1 may be supplied to the organic light emitting diode OLED based on the voltage level held by the storage capacitor CST.

Although the pixel circuit PC of the present disclosure has been described as including seven transistors and one storage capacitor, the configuration of the pixel circuit PC of the present disclosure is not limited thereto. For example, the pixel circuit PC may be configured to include at least one transistor and at least one storage capacitor.

Figure 8:
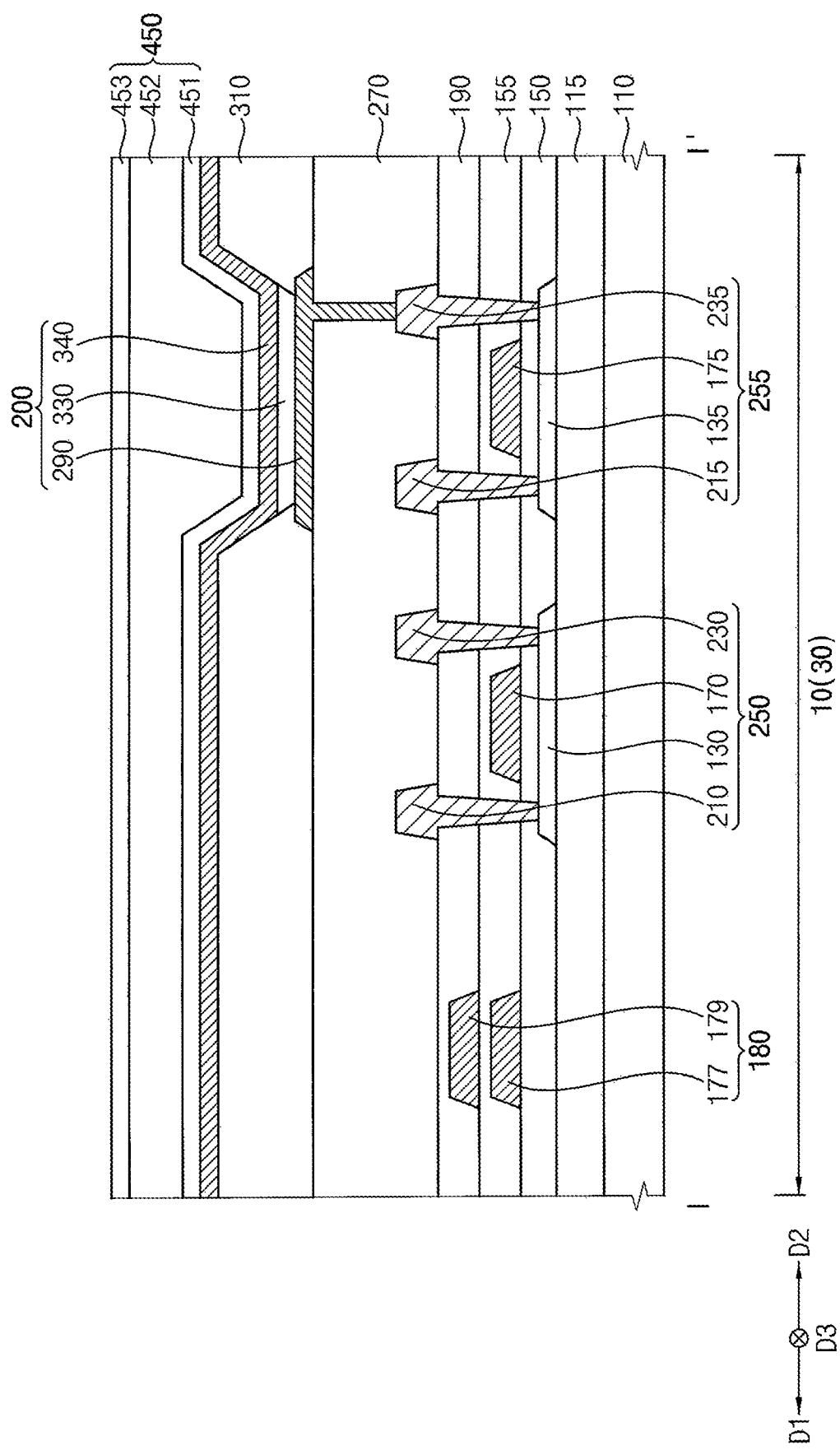
FIG. 8 is a cross-sectional view taken along line I-I' of the organic light emitting diode display device of FIG. 1.
Figure 9:
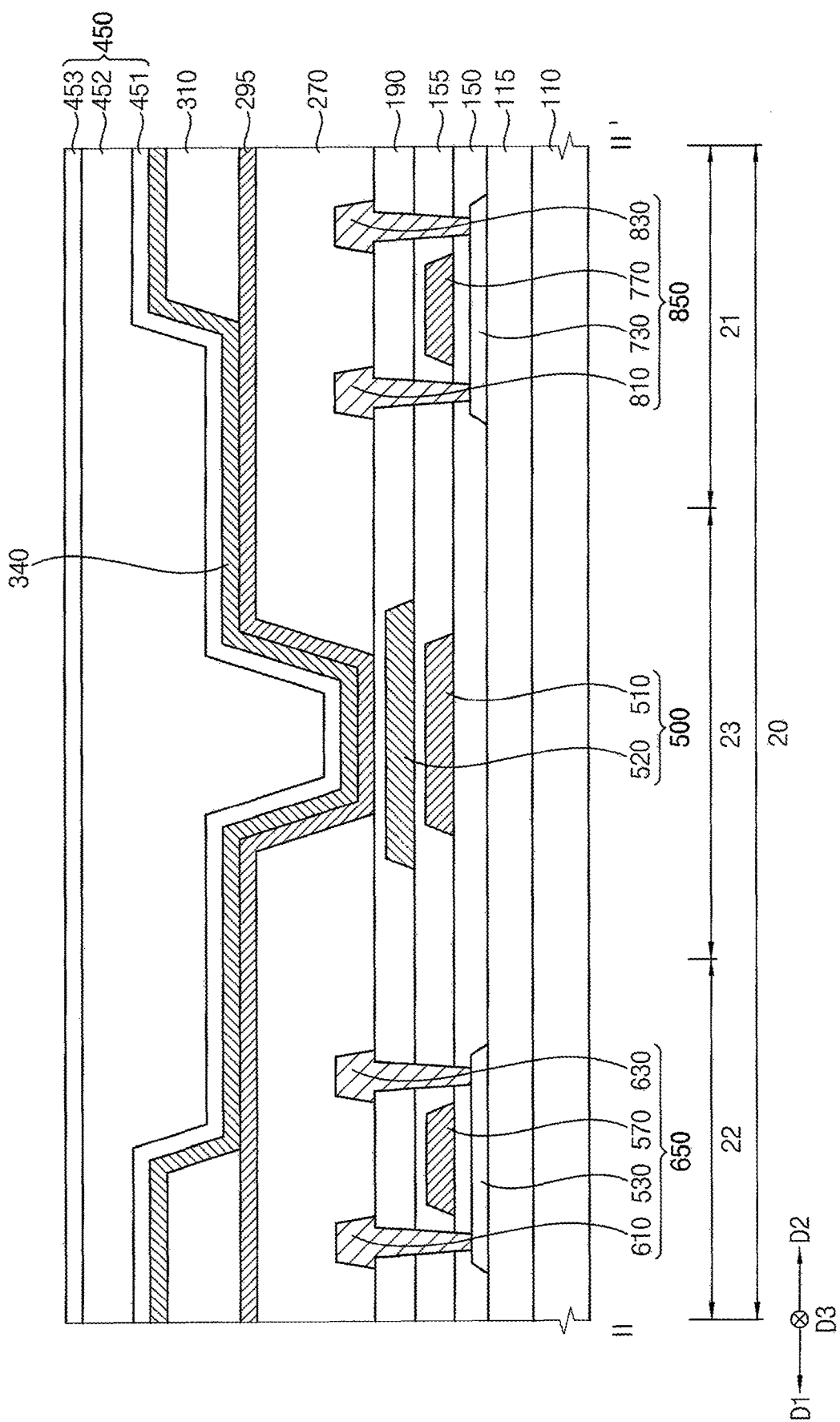
FIG. 9 is a cross-sectional view taken along line II-II' of the organic light emitting diode display device of FIG. 2B.

FIG. 8 is a cross-sectional view taken along line I-I' of the organic light emitting diode display device of FIG. 1. FIG. 9 is a cross-sectional view taken along line II-II' of the organic light emitting diode display device in FIG. 2B.

Referring to FIGS. 8 and 9, the organic light emitting diode display device 100 may include a substrate 110, a buffer layer 115, a first pixel transistor 250, a second pixel transistor 255, a storage capacitor 180, a first circuit transistor 850, a second circuit transistor 650, a first capacitor 500, a first gate insulating layer 150, a second gate insulating layer 155, an insulating interlayer 190, a planarization layer 270, a pixel defining layer 310, a connection electrode 295, a pixel structure 200, a thin film encapsulation structure 450, and the like. The first pixel transistor 250 may include a first active layer 130, a first gate electrode 170, a first source electrode 210, and a first drain electrode 230, and the second pixel transistor 255 may include a second active layer 135, a second gate electrode 175, a second source electrode 215, and a second drain electrode 235. In addition, the first circuit transistor 850 may include a first active pattern 730, a first gate pattern 770, a first source pattern 810, and a first drain pattern 830, and the second circuit transistor 650 may include a second active pattern 530, a second gate pattern 570, a second source pattern 610, and a second drain pattern 630. In addition, the storage capacitor 180 may include a lower gate pattern 177 and an upper gate pattern 179, and the first capacitor 500 may include a first lower electrode 510 and a first upper electrode 520. In addition, the pixel structure 200 may include a first electrode 290, a light emitting layer 330, and a second electrode 340, and the thin film encapsulation structure 450 may include a first inorganic thin film encapsulation layer 451, an organic thin film encapsulation layer 452, and a second inorganic thin film encapsulation layer 453.

The substrate 110 including (e.g., being) transparent or opaque materials may be provided. The substrate 110 may be formed of a transparent resin substrate having flexibility. For example, the substrate 110 may be configured such that a first organic layer, a first barrier layer, a second organic layer, and a second barrier layer are sequentially laminated. The first barrier layer and the second barrier layer may include (e.g., be) an inorganic material such as silicon oxide, and may block moisture and/or humidity from penetrating or permeating through the first and second organic layers. In addition, the first organic layer and the second organic layer may include (e.g., be) an organic material such as polyimide resin, and may have flexibility.

The organic light emitting diode display device 100 includes a display area 10 and a peripheral area 20 including a first circuit area 21, a second circuit area 22, and a blocking area 23, so that the substrate 110 may also be divided into (e.g., may have portions corresponding to) the display area 10 and the peripheral area 20, as shown in FIG. 9.

In some embodiments, the substrate 110 may include a quartz substrate, a synthetic quartz substrate, a calcium fluoride substrate, a fluorine-doped (F-doped) quartz substrate, a soda-lime glass substrate, a non-alkali glass substrate, and/or the like.

Although the substrate 110 has been described as having four layers, the configuration of the substrate 110 of the present disclosure is not limited thereto. For example, in other example embodiments, the substrate 110 may be composed of a single layer or a plurality of layers.

The buffer layer 115 may be disposed on the substrate 110. The buffer layer 115 may be disposed over the whole area of the display area 10 and the peripheral area 20 on the substrate 110. Depending on the type or kind of the substrate 110, two or more buffer layers 115 may be provided on the substrate 110, or the buffer layer 115 may not be disposed thereon. For example, in some embodiments, the buffer layer 115 may be omitted depending on the type or kind of the substrate 110. The buffer layer 115 may include (e.g., be) a silicon compound, metal oxide, and/or the like. For example, the buffer layer 115 may include (e.g., be) silicon oxide (SiO), silicon nitride (SiN), silicon oxynitride (SiON), silicon oxycarbide (SiOC), silicon carbonitride (SiCN), aluminum oxide (AlO), aluminum nitride (AlN), tantalum oxide (TaO), hafnium oxide (HfO), zirconium oxide (ZrO), titanium oxide (TiO), and/or the like.

The first active layer 130 and the second active layer 135 may be disposed in the display area 10 on the buffer layer 115, and the first active pattern 730 and the second active pattern 530 may be disposed in the peripheral area 20 on the buffer layer 115. In some embodiments, the first active layer 130 and the second active layer 135 may be spaced apart from each other in the display area 10, the first active pattern 730 may be positioned in the first circuit area 21, and the second active pattern 530 may be positioned in the second circuit area 22. Each of the first active layer 130, the second active layer 135, the first active pattern 730, and the second active pattern 530 may include (e.g., be) an oxide semiconductor, an inorganic semiconductor (such as amorphous silicon and/or poly silicon), an organic semiconductor, and/or the like. Each of the first active layer 130, the second active layer 135, the first active pattern 730, and the second active pattern 530 may have a source area, a drain area and a channel area positioned between the source area and the drain area.

The first gate insulating layer 150 may be disposed on the first active layer 130, the second active layer 135, the first active pattern 730, and the second active pattern 530. The first gate insulating layer 150 may cover the first active layer 130 and the second active layer 135 in the display area 10 on the buffer layer 115, and may extend from the display area 10 to (e.g., into) the peripheral area 20 to cover the first active pattern 730 in the first circuit area 21 and the second active pattern 530 in the second circuit area 22. For example, the first gate insulating layer 150 may sufficiently cover the first active layer 130, the second active layer 135, the first active pattern 730, and the second active pattern 530 on the buffer layer 115, and may have a substantially planar surface (e.g., a substantially flat top surface) without generating a step around the first active layer 130, the second active layer 135, the first active pattern 730, and the second active pattern 530. In some embodiments, the first gate insulating layer 150 may be disposed to have a uniform thickness along profiles of (e.g., over the top surface of and/or around) the first active layer 130, the second active layer 135, the first active pattern 730 and the second active pattern 530 while covering the first active layer 130, the second active layer 135, the first active pattern 730, and the second active pattern 530 on the buffer layer 115. The first gate insulating layer 150 may include (e.g., be) a silicon compound(s), metal oxide(s), and/or the like. In other example embodiments, the first gate insulating layer 150 may have a multi-layer structure including a plurality of insulating layers. The insulating layers may have mutually different materials and mutually different thicknesses.

The first gate electrode 170 and the second gate electrode 175 may be disposed in the display area 10 on the first gate insulating layer 150, and the first gate pattern 770 and the second gate pattern 570 may be disposed in the peripheral area 20. In some embodiments, the first gate electrode 170 may be disposed on a portion of the first gate insulating layer 150 below which the first active layer 130 is positioned (for example, may be disposed to overlap the channel area of the first active layer 130); the second gate electrode 175 may be disposed on a portion of the first gate insulating layer 150 below which the second active layer 135 is positioned (for example, may be disposed to overlap the channel area of the second active layer 135); the first gate pattern 770 may be disposed on a portion of the first gate insulating layer 150 below which the first active pattern 730 is positioned (for example, may be disposed to overlap the channel area of the second active pattern 530); and the second gate pattern 570 may be disposed on a portion of the first gate insulating layer 150 below which the second active pattern 530 is positioned (for example, may be disposed to overlap the channel area of the second active pattern 530). Each of the first gate electrode 170, the second gate electrode 175, the first gate pattern 770, and the second gate pattern 570 may include (e.g., be) a metal, an alloy, a metal nitride, a conductive metal oxide, a transparent conductive material, and/or the like. In other example embodiments, each of the first gate electrode 170, the second gate electrode 175, the first gate pattern 770, and the second gate pattern 570 may have a multi-layer structure including a plurality of metal layers. The metal layers may have mutually different materials and mutually different thicknesses.

The lower gate pattern 177 may be disposed in the display area 10 on the first gate insulating layer 150, and the first lower electrode 510 may be disposed in the blocking area 23 on the first gate insulating layer 150. In some embodiments, the lower gate pattern 177 may be spaced apart from the first gate electrode 170 and the second gate electrode 175, and the first lower electrode 510 may be spaced apart from the first gate pattern 770 and the second gate pattern 570. In example embodiments, the lower gate pattern 177 and the first lower electrode 510 may be positioned on the same layer as the first gate electrode 170, the second gate electrode 175, the first gate pattern 770, and the second gate pattern 570. Each of the lower gate pattern 177 and the first lower electrode 510 may include (e.g., be) a metal, an alloy, a metal nitride, a conductive metal oxide, a transparent conductive material, and/or the like. For example, each of the lower gate pattern 177 and the first lower electrode 510 may include (e.g., be) gold (Au), silver (Ag), aluminum (Al), platinum (Pt), nickel (Ni), titanium (Ti), palladium (Pd), magnesium (Mg), calcium (Ca), lithium (Li), chromium (Cr), tantalum (Ta), tungsten (W), copper (Cu), molybdenum (Mo), scandium (Sc), neodymium (Nd), iridium (Ir), an alloy containing aluminum, aluminum nitride (AlNx), an alloy containing silver, tungsten nitride (WNx), an alloy containing copper, an alloy containing molybdenum, titanium nitride (TiNx), chromium nitride (CrNx), tantalum nitride (TaNx), strontium ruthenium oxide (SrRuxOy), zinc oxide (ZnOx), indium tin oxide (ITO), tin oxide (SnOx), indium oxide (InOx), gallium oxide (GaOx), indium zinc oxide (IZO), and/or the like. In other example embodiments, each of the lower gate pattern 177 and the first lower electrode 510 may have a multi-layer structure including a plurality of metal layers. The metal layers may have mutually different materials and mutually different thicknesses.

The second gate insulating layer 155 may be disposed on the first gate electrode 170, the second gate electrode 175, the first gate pattern 770, the second gate pattern 570, the lower gate pattern 177, and the first lower electrode 510. The second gate insulating layer 155 may cover the first gate electrode 170, the second gate electrode 175, and the lower gate pattern 177 in the display area 10 on the first gate insulating layer 150, and may extend from the display area 10 to (e.g., into) the peripheral area 20 to cover the first gate pattern 770 in the first circuit area 21, the second gate pattern 570 in the second circuit area 22, and the first lower electrode 510 in the blocking area 23. For example, the second gate insulating layer 155 may sufficiently cover the first gate electrode 170, the second gate electrode 175, the first gate pattern 770, the second gate pattern 570, the lower gate pattern 177, and the first lower electrode 510 on the first gate insulating layer 150, and may have a substantially planar surface (e.g., a substantially flat top surface) without generating a step around the first gate electrode 170, the second gate electrode 175, the first gate pattern 770, the second gate pattern 570, the lower gate pattern 177, and the first lower electrode 510. In some embodiments, the second gate insulating layer 155 may be disposed to have a uniform thickness along profiles of (e.g., over the top surface of and/or around) the first gate electrode 170, the second gate electrode 175, the first gate pattern 770, the second gate pattern 570, the lower gate pattern 177, and the first lower electrode 510 while covering the first gate electrode 170, the second gate electrode 175, the first gate pattern 770, the second gate pattern 570, the lower gate pattern 177, and the lower electrode 510 on the first gate insulating layer 150. The second gate insulating layer 155 may include (e.g., be) a silicon compound(s), metal oxide(s), and/or the like. In other example embodiments, the second gate insulating layer 155 may have a multi-layer structure including a plurality of insulating layers. The insulating layers may have mutually different materials and mutually different thicknesses.

The upper gate pattern 179 may be disposed in the display area 10 on the second gate insulating layer 155, and the first upper electrode 520 may be disposed in the blocking area 23 on the second gate insulating layer 155. In some embodiments, the upper gate pattern 179 may be disposed on a portion of the second gate insulating layer 155 under which the lower gate pattern 177 is portioned (e.g., the upper gate pattern 179 may overlap the lower gate pattern 177), and the first upper electrode 520 may be disposed on a portion of the second gate insulating layer 155 under which the first lower electrode 510 is positioned (e.g., the first upper electrode 520 may overlap the first lower electrode 510). In example embodiments, the first upper electrode 520 may be positioned on the same layer as the upper gate pattern 179. Each of the upper gate pattern 179 and the first upper electrode 520 may include (e.g., be) a metal, an alloy, a metal nitride, a conductive metal oxide, a transparent conductive material, and/or the like. In other example embodiments, each of the upper gate pattern 179 and the first upper electrode 520 may have a multi-layer structure including a plurality of metal layers. The metal layers may have mutually different materials and mutually different thicknesses. Accordingly, the storage capacitor 180 including the lower gate pattern 177 and the upper gate pattern 179 may be disposed, and the first capacitor 500 including the first lower electrode 510 and the first upper electrode 520 may be disposed.

The insulating interlayer 190 may be disposed on the upper gate pattern 179 and the first upper electrode 520. The insulating interlayer 190 may cover the upper gate pattern 179 in the display area 10 on the second gate insulating layer 155, and may extend from the display area 10 to (e.g., into) the peripheral area 20 to cover the first upper electrode 520 in the blocking area 23. For example, the insulating interlayer 190 may sufficiently cover the upper gate pattern 179 and the first upper electrode 520 on the second gate insulating layer 155, and may have a substantially planar surface (e.g., a substantially flat top surface) without generating a step around the upper gate pattern 179 and the first upper electrode 520. In some embodiments, the insulating interlayer 190 may be disposed to have a uniform thickness along profiles of (e.g., over the top surface of and/or around) the upper gate pattern 179 and the first upper electrode 520 while covering the upper gate pattern 179 and the first upper electrode 520 on the second gate insulating layer 155. The insulating interlayer 190 may include (e.g., be) a silicon compound(s), metal oxide(s), and/or the like. In other example embodiments, the insulating interlayer 190 may have a multi-layer structure including a plurality of insulating layers. The insulating layers may have mutually different materials and mutually different thicknesses.

The first source electrode 210, the first drain electrode 230, the second source electrode 215, and the second drain electrode 235 may be disposed in the display area 10 on the insulating interlayer 190, and the first source pattern 810, the first drain pattern 830, the second source pattern 610, and the second drain pattern 630 may be disposed in the peripheral area 20 on the insulating interlayer 190. The first source electrode 210 may be connected to the source area of the first active layer 130 through a contact hole (e.g., a contact hole formed by removing first portions of the first gate insulating layer 150, the second gate insulating layer 155, and the insulating interlayer 190), and the first drain electrode 230 may be connected to the drain area of the active layer 130 through a contact hole (e.g., a contact hole formed by removing second portions of the first gate insulating layer 150, the second gate insulating layer 155, and the insulating interlayer 190). The second source electrode 215 may be connected to the source area of the second active layer 135 through a contact hole (e.g., a contact hole formed by removing third portions of the first gate insulating layer 150, the second gate insulating layer 155, and the insulating interlayer 190), and the second drain electrode 235 may be connected to the drain area of the second active layer 135 through a contact hole (e.g., a contact hole formed by removing fourth portions of the first gate insulating layer 150, the second gate insulating layer 155, and the insulating interlayer 190). The first source pattern 810 may be connected to the source area of the first active pattern 730 through a contact hole (e.g., a contact hole formed by removing fifth portions of the first gate insulating layer 150, the second gate insulating layer 155, and the insulating interlayer 190), and the first drain pattern 830 may be connected to the drain area of the active pattern 730 through a contact hole (e.g., a contact hole formed by removing sixth portions of the first gate insulating layer 150, the second gate insulating layer 155, and the insulating interlayer 190). The second source pattern 610 may be connected to the source area of the second active pattern 530 through a contact hole (e.g., a contact hole formed by removing seventh portions of the first gate insulating layer 150, the second gate insulating layer 155, and the insulating interlayer 190), and the second drain pattern 630 may be connected to the drain area of the second active pattern 530 through a contact hole (e.g., a contact hole formed by removing eighth portions of the first gate insulating layer 150, the second gate insulating layer 155, and the insulating interlayer 190).

Each of the first source electrode 210, the first drain electrode 230, the second source electrode 215, the second drain electrode 235, the first source pattern 810, the first drain pattern 830, the second source pattern 610, and the second drain pattern 630 may include (e.g., be) a metal, an alloy, a metal nitride, a conductive metal oxide, a transparent conductive material, and/or the like. In other example embodiments, each of the first source electrode 210, the first drain electrode 230, the second source electrode 215, the second drain electrode 235, the first source pattern 810, the first drain pattern 830, the second source pattern 610, and the second drain pattern 630 may have a multi-layer structure including a plurality of layers (e.g., a plurality of metal layers). The metal layers may have mutually different materials and mutually different thicknesses.

Accordingly, the first pixel transistor 250 including the first active layer 130, the first gate electrode 170, the first source electrode 210, and the first drain electrode 230 may be disposed; the second pixel transistor 255 including the second active layer 135, the second gate electrode 175, the second source electrode 215, and the second drain electrode 235 may be disposed; the first circuit transistor 850 including the first active pattern 730, the first gate pattern 770, the first source pattern 810, and the first drain pattern 830 may be disposed; and the second circuit transistor 650 including the second active pattern 530, the second gate pattern 570, the second source pattern 610, and the second drain pattern 630 may be disposed.

The planarization layer 270 may be disposed on the first source electrode 210, the first drain electrode 230, the second source electrode 215, the second drain electrode 235, the first source pattern 810, the first drain pattern 830, the second source pattern 610, and the second drain pattern 630. The planarization layer 270 may cover the first source electrode 210, the first drain electrode 230, the second source electrode 215, and the second drain electrode 235 in the display area 10 on the insulating interlayer 190, and may extend to (e.g., into) the peripheral area 20 to cover the first source pattern 810 and the first drain pattern 830 in the first circuit area 21 and the second source pattern 610 and the second drain pattern 630 in the second circuit area 22. In example embodiments, the planarization layer 270 may have a first opening 271 that exposes the top surface of the insulating interlayer 190 in the blocking area 23 (see FIG. 16). Thus, the planarization layer 270 may not be disposed in the blocking area 23. The first opening 271 may be positioned to overlap the first capacitor 500, and may be positioned to overlap the second capacitor 700 of FIG. 2B. The connection electrode 295 may come into contact with the insulating interlayer 190 through the first opening 271.

The planarization layer 270 may have a relatively thick (e.g., large) thickness in the display area 10 and the peripheral area 20. In this case, the planarization layer 270 may have a substantially planar upper surface (e.g., a substantially flat top surface), and a planarization process may be added to the planarization layer 270 to implement the above planar upper surface of the planarization layer 270. In some embodiments, the planarization layer 270 may be disposed to have a uniform thickness in the display area 10 and the peripheral area 20 on the insulating interlayer 190 along profiles of (e.g., over the top surface of and/or around) the first source electrode 210, the first drain electrode 230, the second source electrode 215, the second drain electrode 235, the first source pattern 810, the first drain pattern 830, the second source pattern 610, and the second drain pattern 630. The planarization layer 270 may be formed of an organic material or an inorganic material. In example embodiments, the planarization layer 270 may include (e.g., be) an organic material. For example, the planarization layer 270 may include (e.g., be) photoresist, polyacryl-based resin, polyimide-based resin, polyamide-based resin, siloxane-based resin, acryl-based resin, epoxy-based resin, and/or the like.

The first electrode 290 may be disposed in the display area 10 on the planarization layer 270. The first electrode 290 may be connected to the second drain electrode 235 through a contact hole (e.g., a contact hole formed by removing a part of the planarization layer 270), and the first electrode 290 may be electrically connected to the second pixel transistor 255. The first electrode 290 may include (e.g., be) a metal, an alloy, a metal nitride, a conductive metal oxide, a transparent conductive material, and/or the like. In other example embodiments, the first electrode 290 may have a multi-layer structure including a plurality of layers (e.g., a plurality of metal layers). The metal layers may have mutually different materials and mutually different thicknesses.

The connection electrode 295 may be disposed in the peripheral area 20 on the planarization layer 270. The connection electrode 295 may come into contact with the insulating interlayer 190 through the first opening 271, and may come into contact with the second electrode 340 through the second opening 311 (see FIG. 18). The connection electrode 295 may come into contact with the low power supply voltage ELVSS wiring in the peripheral area 20, and may receive the low power supply voltage ELVSS from the low power supply voltage ELVSS wiring. The connection electrode 295 comes into contact with the second electrode 340 in the blocking area 23, so that the low power supply voltage ELVSS applied to the connection electrode 295 may be transmitted to the second electrode 340. The connection electrode 295 may include (e.g., be) a metal, an alloy, a metal nitride, a conductive metal oxide, a transparent conductive material, and/or the like. In other example embodiments, the connection electrode 295 may have a multi-layer structure including a plurality of layers (e.g., a plurality of metal layers). The metal layers may have mutually different materials and mutually different thicknesses.

The pixel defining layer 310 may expose a part (e.g., a center portion) of the first electrode 290 in the display area 10 on the planarization layer 270, and may extend from the display area 10 to (e.g., into) the peripheral area 20 so as to be disposed in the first circuit area 21 and the second circuit area 22. In example embodiments, the pixel defining layer 310 may have a second opening 311 overlapping the first opening 271 in the blocking area 23 (see FIG. 18). Thus, the pixel defining layer 310 may not be disposed in the blocking area 23. The second electrode 340 may come into contact with the connection electrode 295 through the second opening 311. In addition, a width of the first opening 271 may be smaller than a width of the second opening 311. The pixel defining layer 310 may be formed of an organic material or an inorganic material. In example embodiments, the pixel defining layer 310 may include (e.g., be) an organic material.

The light emitting layer 330 may be disposed on the first electrode 290 partially exposed by the pixel defining layer 310 in the display area 10. The light emitting layer 330 may be formed by utilizing (e.g., may be formed from) at least one selected from among light emitting materials capable of emitting color lights (such as red light, green light, and blue light) that are different according to pixels. In some embodiments, the light emitting layer 330 may be formed by laminating a plurality of light emitting materials capable of generating different color light such as red light, green light and blue light, such that white light may be emitted as a whole. In this case, a color filter may be disposed on the light emitting layer 330. The color filter may include at least one selected from among a red color filter, a green color filter, and a blue color filter. In some embodiments, the color filter also may include a yellow color filter, a cyan color filter, and/or a magenta color filter. The color filter may include (e.g., be) photosensitive resin and/or color photoresist.

The second electrode 340 may be disposed in the display area 10 on the pixel defining layer 310 and the light emitting layer 330, and may extend to (e.g., into) the peripheral area 20 to overlap the first opening 271 and the second opening 311 in the peripheral area 20. In example embodiments, the second electrode 340 may come into contact with the connection electrode 295 through the second opening 311. The second electrode 340 may include (e.g., be) a metal, an alloy, a metal nitride, a conductive metal oxide, a transparent conductive material, and/or the like. In other example embodiments, the second electrode 340 may have a multi-layer structure including a plurality of metal layers. The metal layers may have mutually different materials and mutually different thicknesses.

Accordingly, the pixel structure 200 including the first electrode 290, the light emitting layer 330, and the second electrode 340 may be disposed.

The first inorganic thin film encapsulation layer 451 may be disposed in the display area 10 and the peripheral area 20 on the second electrode 340. The first inorganic thin film encapsulation layer 451 may be disposed to have a uniform thickness along a profile of (e.g., over the top surface of and/or around) the second electrode 340 while covering the second electrode 340. The first inorganic thin film encapsulation layer 451 may prevent or reduce the deterioration of the pixel structure 200 due to the penetration and/or permeation of the moisture, oxygen, and/or the like. In addition, the first inorganic thin film encapsulation layer 451 may also function to protect the pixel structure 200 from external impact. The first inorganic thin film encapsulation layer 451 may include (e.g., be) flexible inorganic materials.

The organic thin film encapsulation layer 452 may be disposed in the display area 10 and the peripheral area 20 on the first inorganic thin film encapsulation layer 451. The organic thin film encapsulation layer 452 may improve the flatness of the organic light emitting diode display device 100, and may protect the pixel structure 200. For example, the organic thin film encapsulation layer 452 may have a substantially flat top surface. The organic thin film encapsulation layer 452 may include (e.g., be) flexible organic materials.

The second inorganic thin film encapsulation layer 453 may be disposed in the display area 10 and the peripheral area 20 on the organic thin film encapsulation layer 452. The second inorganic thin film encapsulation layer 453 may be disposed to have a uniform thickness along the profile of (e.g., over the top surface of and/or around) the organic thin film encapsulation layer 452 while covering the organic thin film encapsulation layer 452. The second inorganic thin film encapsulation layer 453 may prevent or reduce the deterioration of the pixel structure 200 due to the penetration and/or permeation of the moisture, oxygen, and/or the like, together with the first inorganic thin film encapsulation layer 451. In addition, the second inorganic thin film encapsulation layer 453 may also function to protect the pixel structure 200 from the external impact, together with the first inorganic thin film encapsulation layer 451 and the organic thin film encapsulation layer 452. The second inorganic thin film encapsulation layer 453 may include (e.g., be) flexible inorganic materials. In some embodiments, the thin film encapsulation structure 450 may have a five-layer structure laminated with first to fifth thin film encapsulation layers or a seven-layer structure laminated with first to seventh thin film encapsulation layers.

Accordingly, the thin film encapsulation structure 450 including the first inorganic thin film encapsulation layer 451, the organic thin film encapsulation layer 452, and the second inorganic thin film encapsulation layer 453 may be disposed.

Therefore, the organic light emitting diode display device 100 shown in FIGS. 1 to 9 may be provided.

In the organic light emitting diode display device 100 according to the example embodiments of the present disclosure, when the first capacitor 500 included in first circuit structure 800, and the second capacitor 700 included in the second circuit structure 600 are disposed in the blocking area 23, the area of each of the first circuit area 21 and the second circuit area 22 of the organic light emitting diode display device 100 may be relatively decreased. Accordingly, a dead space of the organic light emitting diode display device 100 may be decreased.

Figure 10:
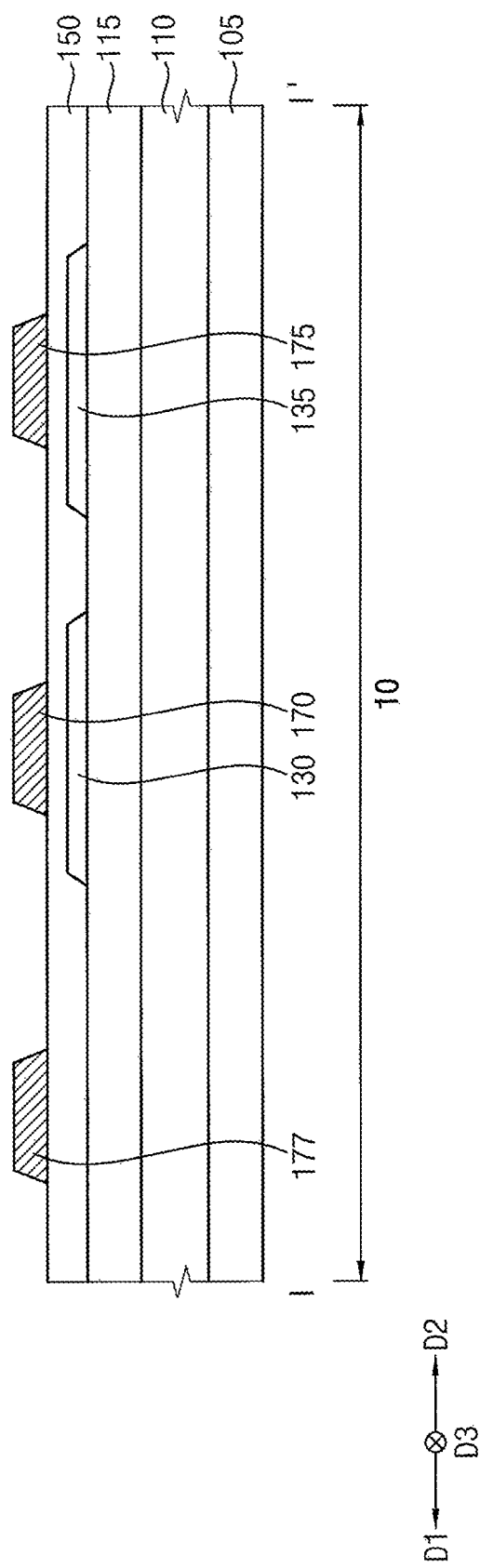
FIGS. 10, 11 and 13 to 22 are cross-sectional views.
Figure 11:
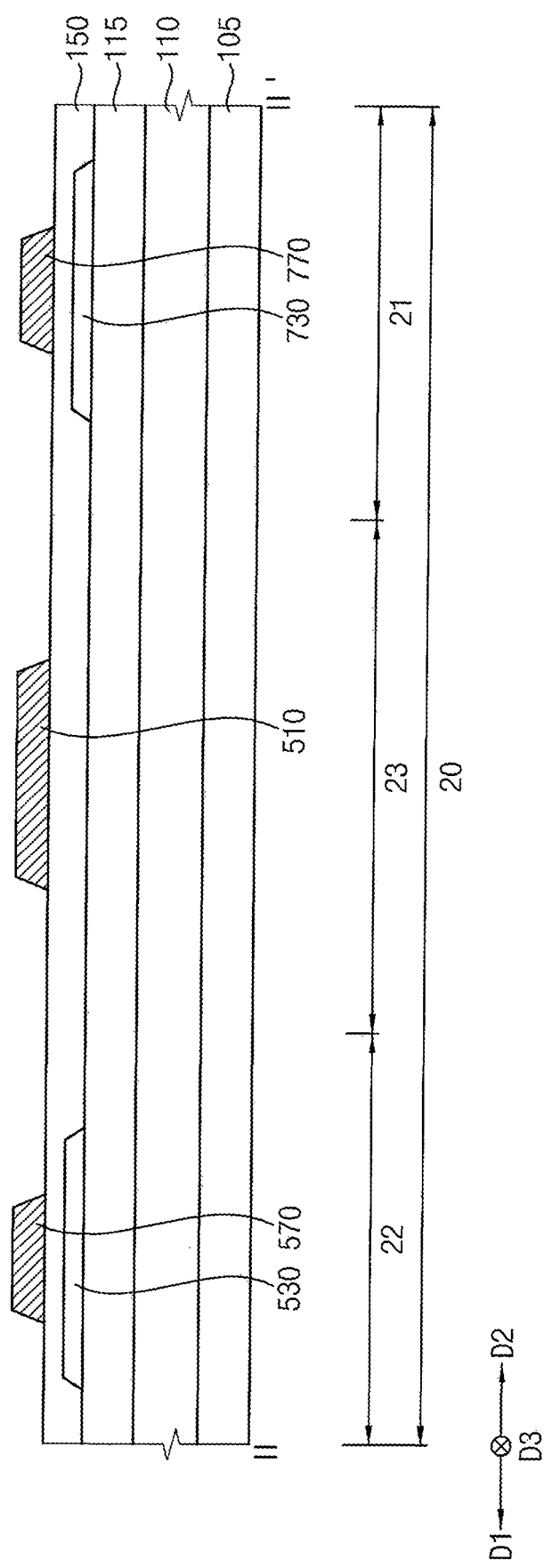
Figure 12:
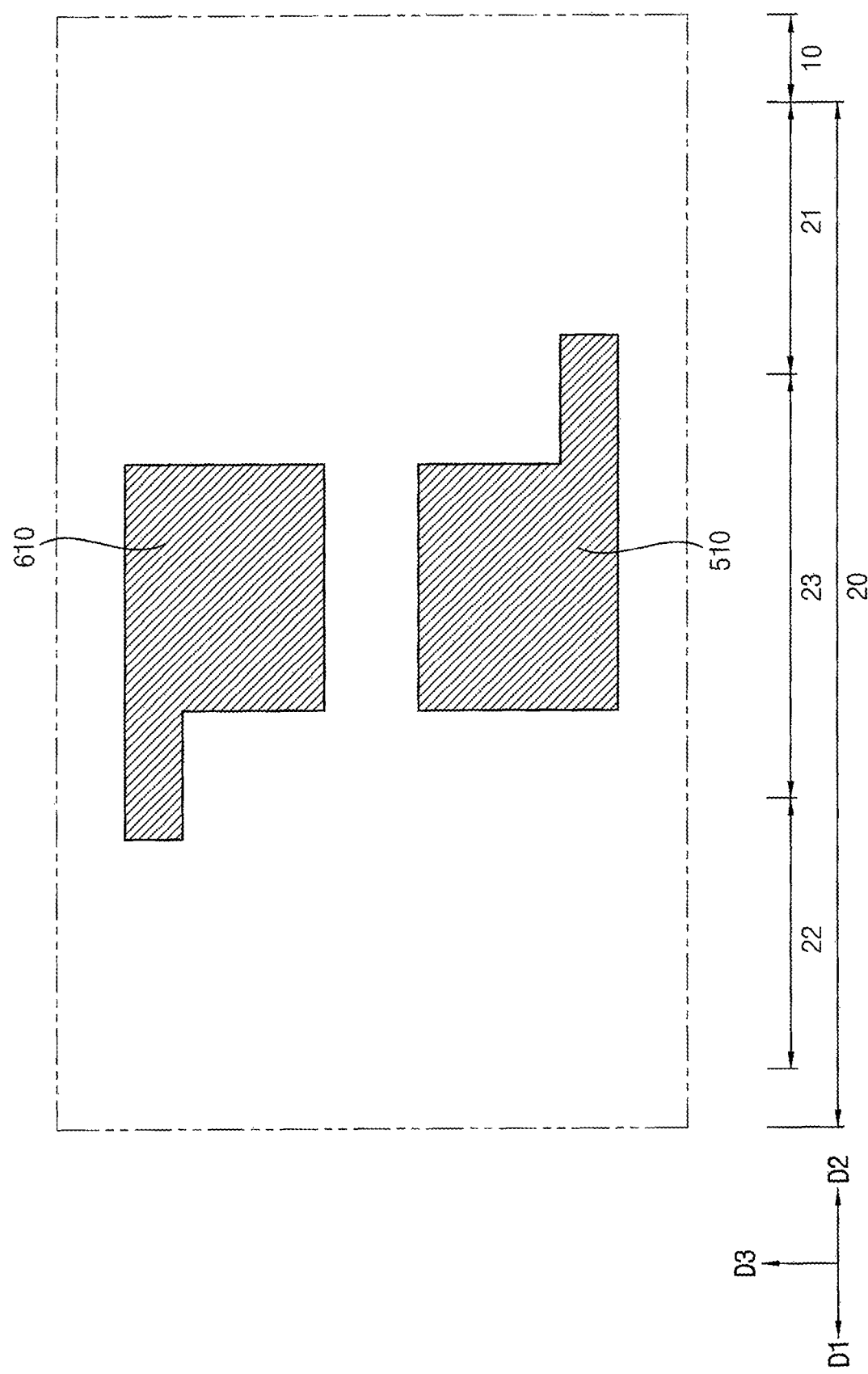
FIG. 12 is an enlarged plan view, showing a method of manufacturing an organic light emitting diode display device according to example embodiments of the present disclosure.

FIGS. 10, 11 and 13 to 22 are cross-sectional views, and FIG. 12 is an enlarged plan view, showing a method of manufacturing an organic light emitting diode display device according to example embodiments of the present disclosure.

Referring to FIGS. 10, 11 and 12, a hard glass substrate 105 may be provided. The substrate 110 including (e.g., being) transparent or opaque materials may be formed on the glass substrate 105. The substrate 110 may be formed by utilizing (e.g., may be formed from) a transparent resin substrate having flexibility. The substrate 110 may be divided into (e.g., may have portions corresponding to) a display area 10 and a peripheral area 20 including a first circuit area 21, a second circuit area 22, and a blocking area 23.

A buffer layer 115 may be formed on the substrate 110. The buffer layer 115 may be formed over the whole area of the display area 10 and the peripheral area 20 on the substrate 110. The buffer layer 115 may be formed by utilizing (e.g., may be formed from) a silicon compound, metal oxide, and/or the like. For example, the buffer layer 115 may include (e.g., be) SiO, SiN, SiON, SiOC, SiCN, AlO, AlN, TaO, HfO, ZrO, TiO, and/or the like.

The first active layer 130 and the second active layer 135 may be formed in the display area 10 on the buffer layer 115, and the first active pattern 730 and the second active pattern 530 may be formed in the peripheral area 20 on the buffer layer 115. For example, after a preliminary active layer is formed over the whole area of the buffer layer 115, the preliminary active layer is partially etched, so that the first active layer 130, the second active layer 135, the first active pattern 730, and the second active pattern 530 may be formed (e.g., simultaneously formed or formed from the same layer). In some embodiments, each of the first active layer 130, the second active layer 135, the first active pattern 730, and the second active pattern 530 may include (e.g., be) the same material. For example, each of the first active layer 130, the second active layer 135, the first active pattern 730, and the second active pattern 530 may be formed by utilizing (e.g., may be formed from) an oxide semiconductor, an inorganic semiconductor, or an organic semiconductor. Each of the first active layer 130, the second active layer 135, the first active pattern 730, and the second active pattern 530 may have a source area, a drain area and a channel area positioned between the source area and the drain area.

The first gate insulating layer 150 may be formed on the first active layer 130, the second active layer 135, the first active pattern 730, and the second active pattern 530. The first gate insulating layer 150 may cover the first active layer 130 and the second active layer 135 in the display area 10 on the buffer layer 115, and may extend from the display area 10 to (e.g., into) the peripheral area 20 to cover the first active pattern 730 in the first circuit area 21 and the second active pattern 530 in the second circuit area 22. The first gate insulating layer 150 may be formed by utilizing (e.g., may be formed from) a silicon compound, metal oxide, and/or the like.

The first gate electrode 170, the second gate electrode 175, and the lower gate pattern 177 may be formed in the display area 10 on the first gate insulating layer 150, and the first gate pattern 770, the second gate pattern 570, and the first lower electrode 510 may be formed in the peripheral area 20. For example, after a preliminary first electrode layer is formed over a whole area of the first gate insulating layer 150, the preliminary first electrode layer is partially etched, so that the first gate electrode 170, the second gate electrode 175, the first gate pattern 770, the second gate pattern 570, the lower gate pattern 177, and the first lower electrode 510 may be formed (e.g., simultaneously formed or formed from the same layer). In some embodiments, each of the first gate electrode 170, the second gate electrode 175, the first gate pattern 770, the second gate pattern 570, the lower gate pattern 177, and the first lower electrode 510 may include (e.g., be) the same material, and may be formed by utilizing (e.g., may be formed from) a metal, an alloy, a metal nitride, a conductive metal oxide, a transparent conductive material, and/or the like. For example, each of the first gate electrode 170, the second gate electrode 175, the first gate pattern 770, the second gate pattern 570, the lower gate pattern 177, and the first lower electrode 510 may include (e.g., be) Au, Ag, Al, Pt, Ni, Ti, Pd, Mg, Ca, Li, Cr, Ta, W, Cu, Mo, Sc, Nd, Ir, an alloy containing aluminum, AlN, an alloy containing silver, WN, an alloy containing copper, an alloy containing molybdenum, TiN, CrN, TaN, SrRuO, ZnO, ITO, SnO, InO, GaO, IZO, and/or the like.

Figure 13:
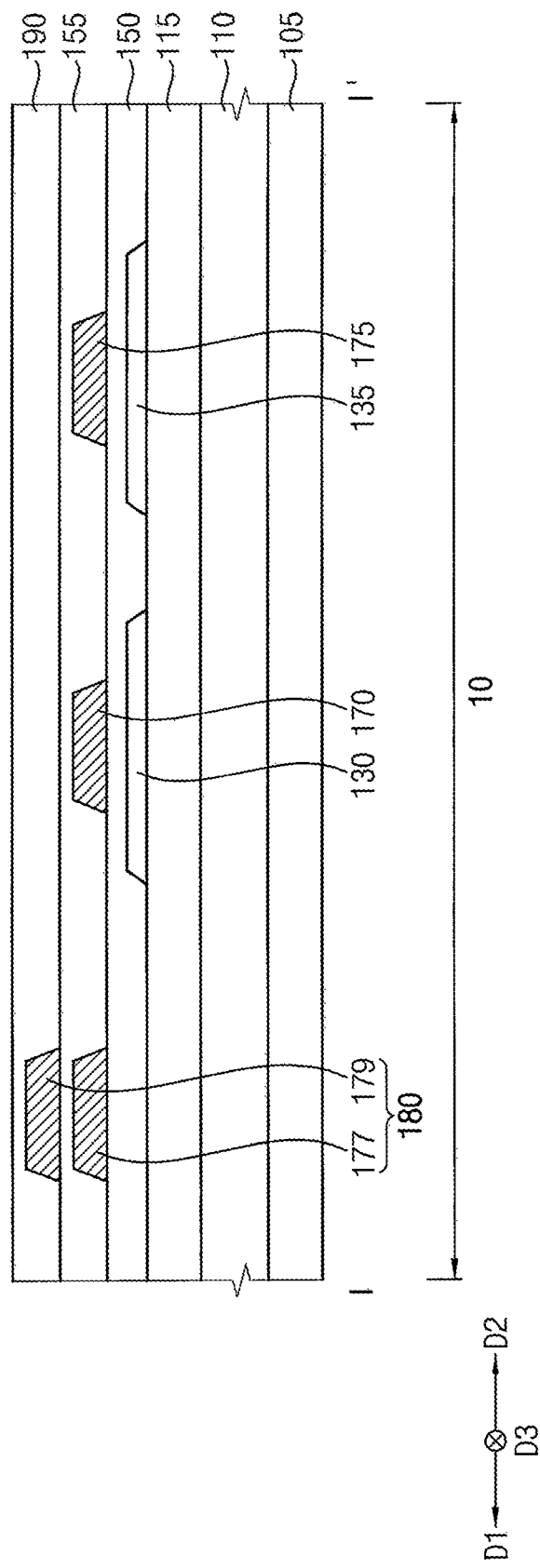
Figure 14:
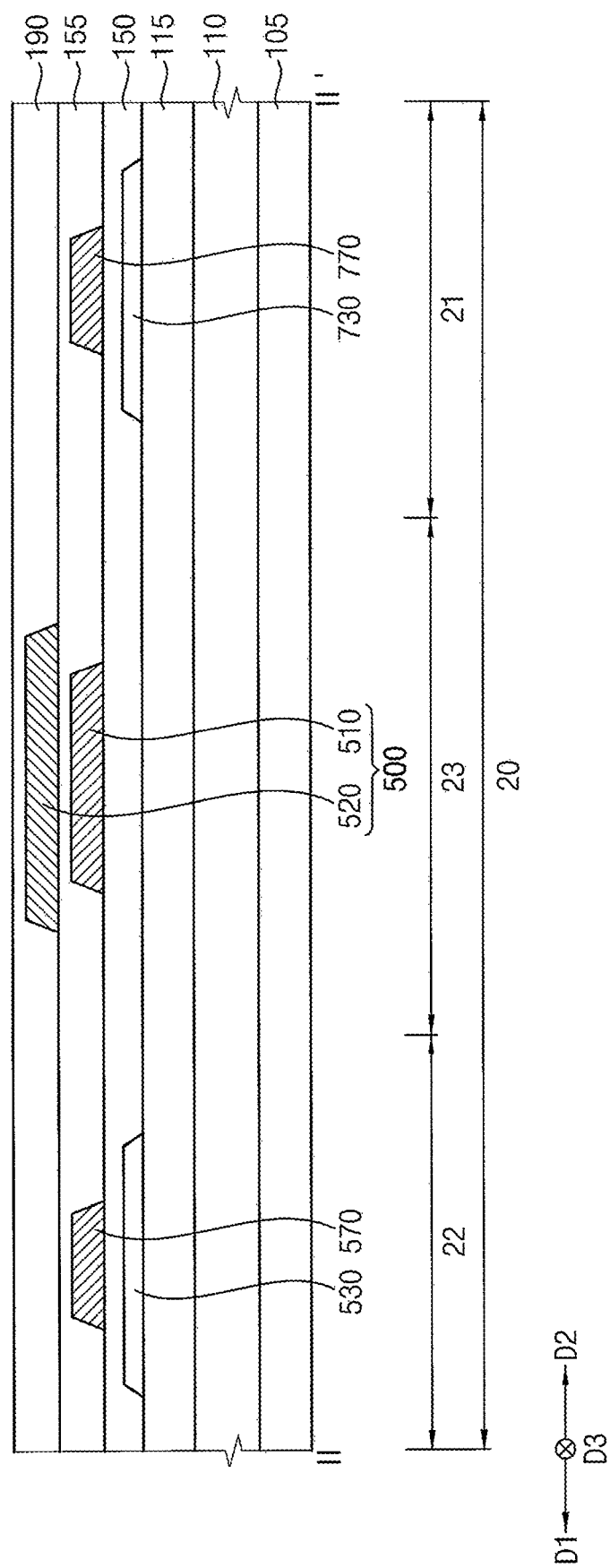

Referring to FIGS. 13, 14 and 2b, the second gate insulating layer 155 may be formed on the first gate electrode 170, the second gate electrode 175, the first gate pattern 770, the second gate pattern 570, the lower gate pattern 177, and the first lower electrode 510. The second gate insulating layer 155 may cover the first gate electrode 170, the second gate electrode 175, and the lower gate pattern 177 in the display area 10 on the first gate insulating layer 150, and may extend from the display area 10 to (e.g., into) the peripheral area 20 to cover the first gate pattern 770 in the first circuit area 21, the second gate pattern 570 in the second circuit area 22, and the first lower electrode 510 in the blocking area 23. The second gate insulating layer 155 may be formed by utilizing (e.g., may be formed from) a silicon compound, metal oxide, and/or the like.

The upper gate pattern 179 may be formed in the display area 10 on the second gate insulating layer 155, and the first upper electrode 520 may be formed in the blocking area 23 on the second gate insulating layer 155. For example, after a preliminary second electrode layer is formed over a whole area of the second gate insulating layer 155, the preliminary second electrode layer is partially etched, so that the upper gate pattern 179, the first upper electrode 520, and the second upper electrode 720 may be formed (e.g., simultaneously formed or formed from the same layer). In some embodiments, each of the upper gate pattern 179, the first upper electrode 520, and the second upper electrode 720 may include (e.g., be) the same material, and may be formed by utilizing (e.g., may be formed from) a metal, an alloy, a metal nitride, a conductive metal oxide, a transparent conductive material, and/or the like.

Accordingly, the storage capacitor 180 including the lower gate pattern 177 and the upper gate pattern 179, the first capacitor 500 including the first lower electrode 510 and the first upper electrode 520, and the second capacitor 700 including the second lower electrode 710 and the second upper electrode 720 may be formed (e.g., simultaneously formed or formed from the same layer).

Figure 15:
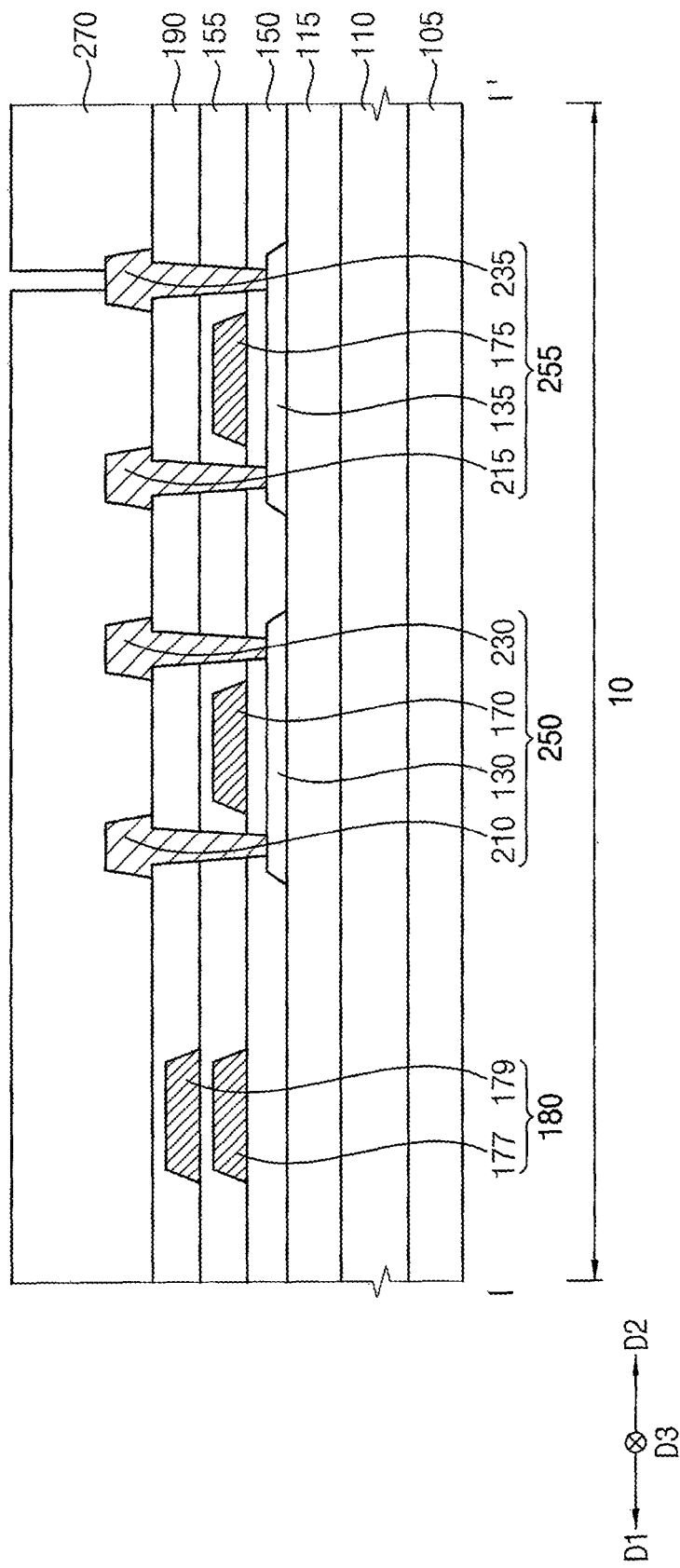
Figure 16:
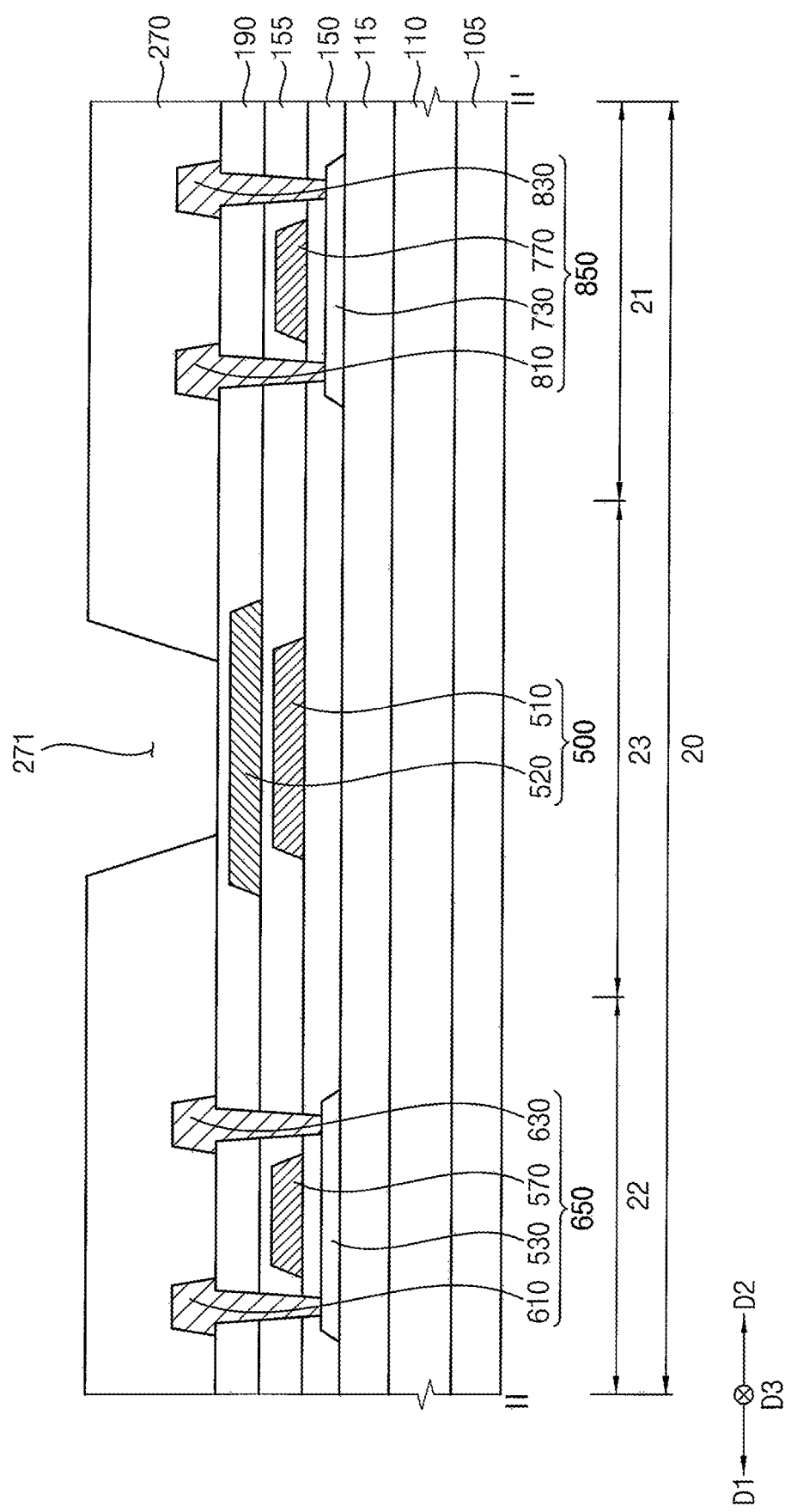

Referring to FIGS. 15 and 16, the insulating interlayer 190 may be formed on the upper gate pattern 179, the first upper electrode 520, and the second upper electrode 720. The insulating interlayer 190 may cover the upper gate pattern 179 in the display area 10 on the second gate insulating layer 155, and may extend from the display area 10 to (e.g., into) the peripheral area 20 to cover the first upper electrode 520 and the second upper electrode 720 in the blocking area 23. The insulating interlayer 190 may be formed by utilizing (e.g., may be formed from) a silicon compound, metal oxide, and/or the like.

The first source electrode 210, the first drain electrode 230, the second source electrode 215, and the second drain electrode 235 may be formed in the display area 10 on the insulating interlayer 190, and the first source pattern 810, the first drain pattern 830, the second source pattern 610, and the second drain pattern 630 may be formed in the peripheral area 20 on the insulating interlayer 190. The first source electrode 210 and the first drain electrode 230 may be connected to the source and drain areas of the first active layer 130 through contact holes (e.g., contact holes formed by removing first and second portions of the first gate insulating layer 150, the second gate insulating layer 155, and the insulating interlayer 190, respectively). The second source electrode 215 and the second drain electrode 235 may be connected to the source and drain areas of the second active layer 135 through contact holes (e.g., contact holes formed by removing third and fourth portions of the first gate insulating layer 150, the second gate insulating layer 155, and the insulating interlayer 190, respectively). The first source pattern 810 and the first drain pattern 830 may be connected to the source and drain areas of the first active pattern 730 through contact holes (e.g., contact holes formed by removing fifth and sixth portions of the first gate insulating layer 150, the second gate insulating layer 155, and the insulating interlayer 190, respectively). The second source pattern 610 and the second drain pattern 630 may be connected to the source and drain areas of the second active pattern 530 through contact holes (e.g., contact holes formed by removing seventh and eighth portions of the first gate insulating layer 150, the second gate insulating layer 155, and the insulating interlayer 190, respectively).

For example, after a preliminary third electrode layer is formed over a whole area of the insulating interlayer 190, the preliminary third electrode layer is partially etched, so that the first source/drain electrodes 210 and 230, the second source/drain electrodes 215 and 235, the first source/drain patterns 810 and 830, and the second source/drain patterns 610 and 630 may be formed (e.g., simultaneously formed or formed from the same layer). In some embodiments, each of the first source/drain electrodes 210 and 230, the second source/drain electrodes 215 and 235, the first source/drain patterns 810 and 830, and the second source/drain patterns 610 and 630 may include (e.g., be) the same material, and may be formed by utilizing (e.g., may be formed from) a metal, an alloy, a metal nitride, a conductive metal oxide, a transparent conductive material, and/or the like.

Accordingly, the first pixel transistor 250 including the first active layer 130, the first gate electrode 170, the first source electrode 210, and the first drain electrode 230; the second pixel transistor 255 including the second active layer 135, the second gate electrode 175, the second source electrode 215, and the second drain electrode 235; the first circuit transistor 850 including the first active pattern 730, the first gate pattern 770, the first source pattern 810, and the first drain pattern 830; and the second circuit transistor 650 including the second active pattern 530, the second gate pattern 570, the second source pattern 610, and the second drain pattern 630 may be formed (e.g., simultaneously formed or formed from the same layer).

The planarization layer 270 may be formed on the first source/drain electrodes 210 and 230, the second source/drain electrodes 215 and 235, the first source/drain patterns 810 and 830, and the second source/drain patterns 610 and 630. The planarization layer 270 may cover the first source/drain electrodes 210 and 230 and the second source/drain electrodes 215 and 235 in the display area 10 on the insulating interlayer 190, and may extend to (e.g., into) the peripheral area 20 to cover the first source/drain patterns 810 and 830 in the first circuit area 21, and the second source/drain patterns 610 and 630 in the second circuit area 22. In example embodiments, the planarization layer 270 may have a first opening 271 that exposes the top surface of the insulating interlayer 190 in the blocking area 23, and a contact hole that exposes a part of the second drain electrode 235 of the second pixel transistor 255. Thus, the planarization layer 270 may not be formed in the blocking area 23. In some embodiments, the first opening 271 may be positioned to overlap the first capacitor 500 and the second capacitor 700. The planarization layer 270 may include (e.g., be) an organic material. For example, the planarization layer 270 may be formed by utilizing (e.g., may be formed from) photoresist, polyacryl-based resin, polyimide-based resin, polyimide-based resin, siloxane-based resin, acryl-based resin, epoxy-based resin, and/or the like.

Figure 17:
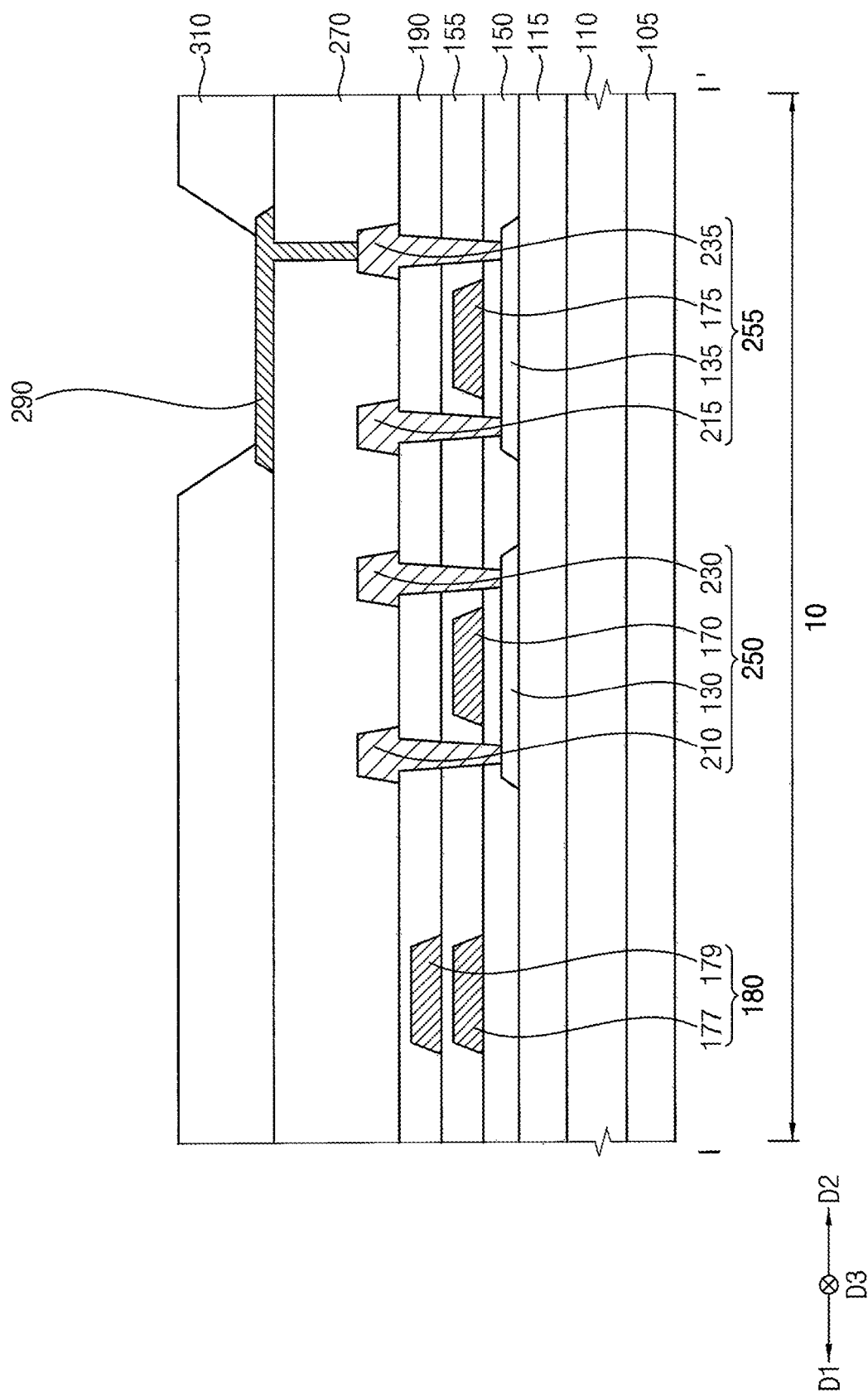
Figure 18:
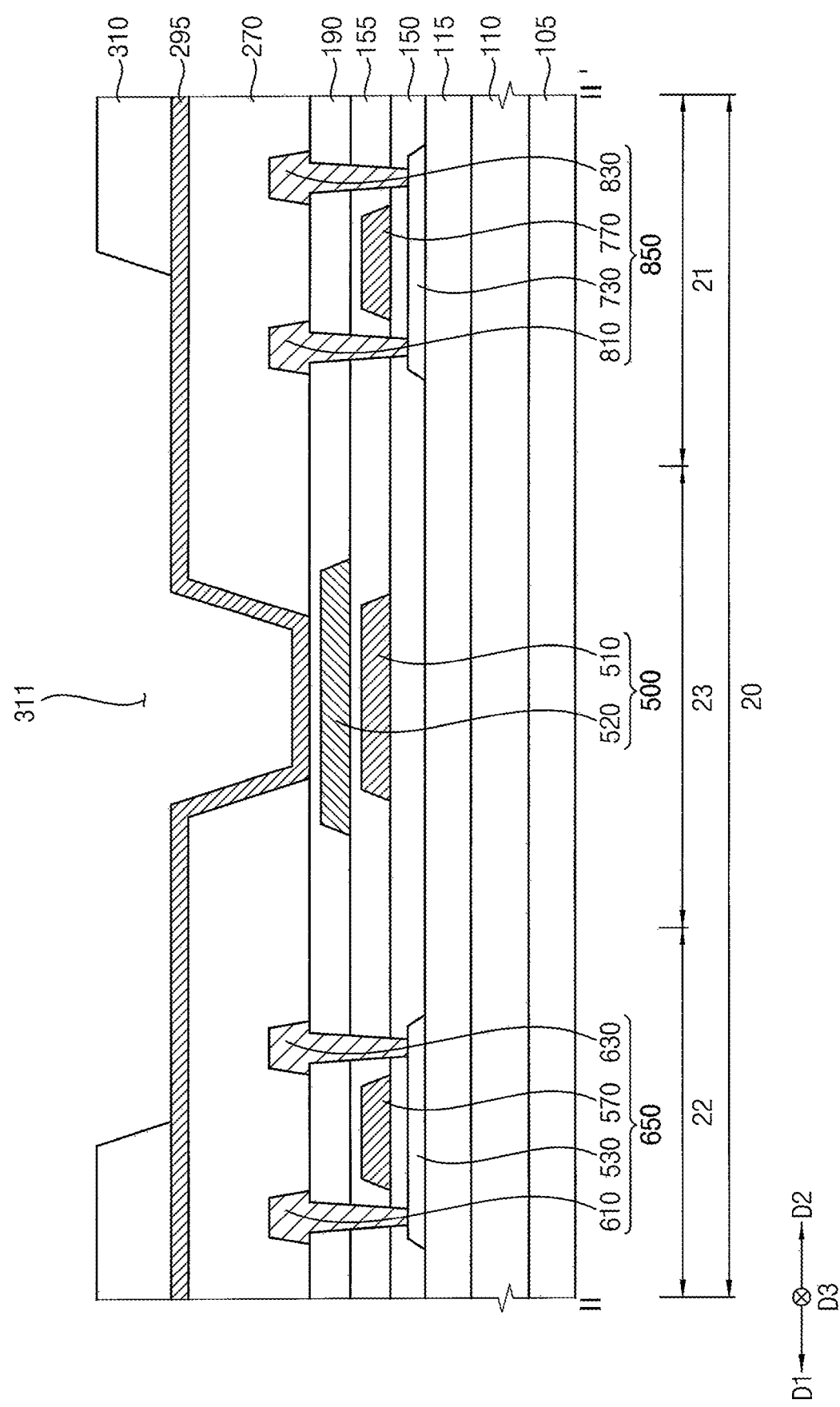

Referring to FIGS. 17 and 18, the first electrode 290 may be formed in the display area 10 on the planarization layer 270, and the connection electrode 295 may be formed in the peripheral area 20 on the planarization layer 270. The first electrode 290 may be connected to the second drain electrode 235 through the contact hole (e.g., the contact hole formed by removing a part of the planarization layer 270), and the connection electrode 295 may come into contact with the insulating interlayer 190 through the first opening 271. For example, after a preliminary fourth electrode layer is formed over a whole area of the planarization layer 270, the preliminary fourth electrode layer is partially etched, so that the first electrode 290 and the connection electrode 295 may be formed (e.g., simultaneously formed or formed from the same layer). In some embodiments, each of the first electrode 290 and the connection electrode 295 may include (e.g., be) the same material, and may be formed by utilizing (e.g., may be formed from) a metal, an alloy, a metal nitride, a conductive metal oxide, a transparent conductive material, and/or the like.

The pixel defining layer 310 may expose a part of the first electrode 290 in the display area 10 on the planarization layer 270, and may extend from the display area 10 to (e.g., into) the peripheral area 20 so as to be formed in the first circuit area 21 and the second circuit area 22. In example embodiments, the pixel defining layer 310 may have a second opening 311 that overlaps the first opening 271 in the blocking area 23. Thus, the pixel defining layer 310 may not be formed in the blocking area 23. The pixel defining layer 310 may be formed by utilizing (e.g., may be formed from) an organic material.

Figure 19:
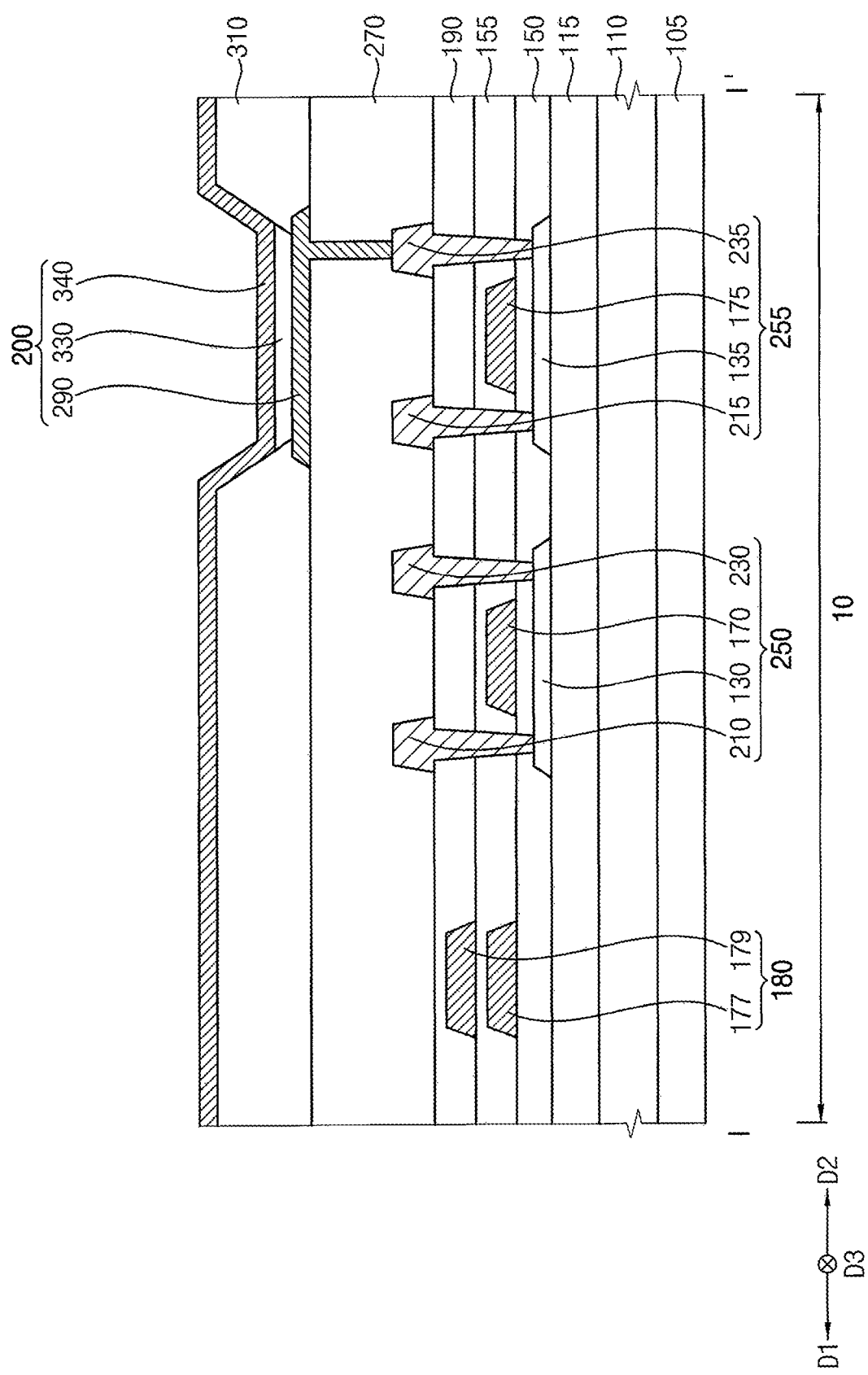
Figure 20:
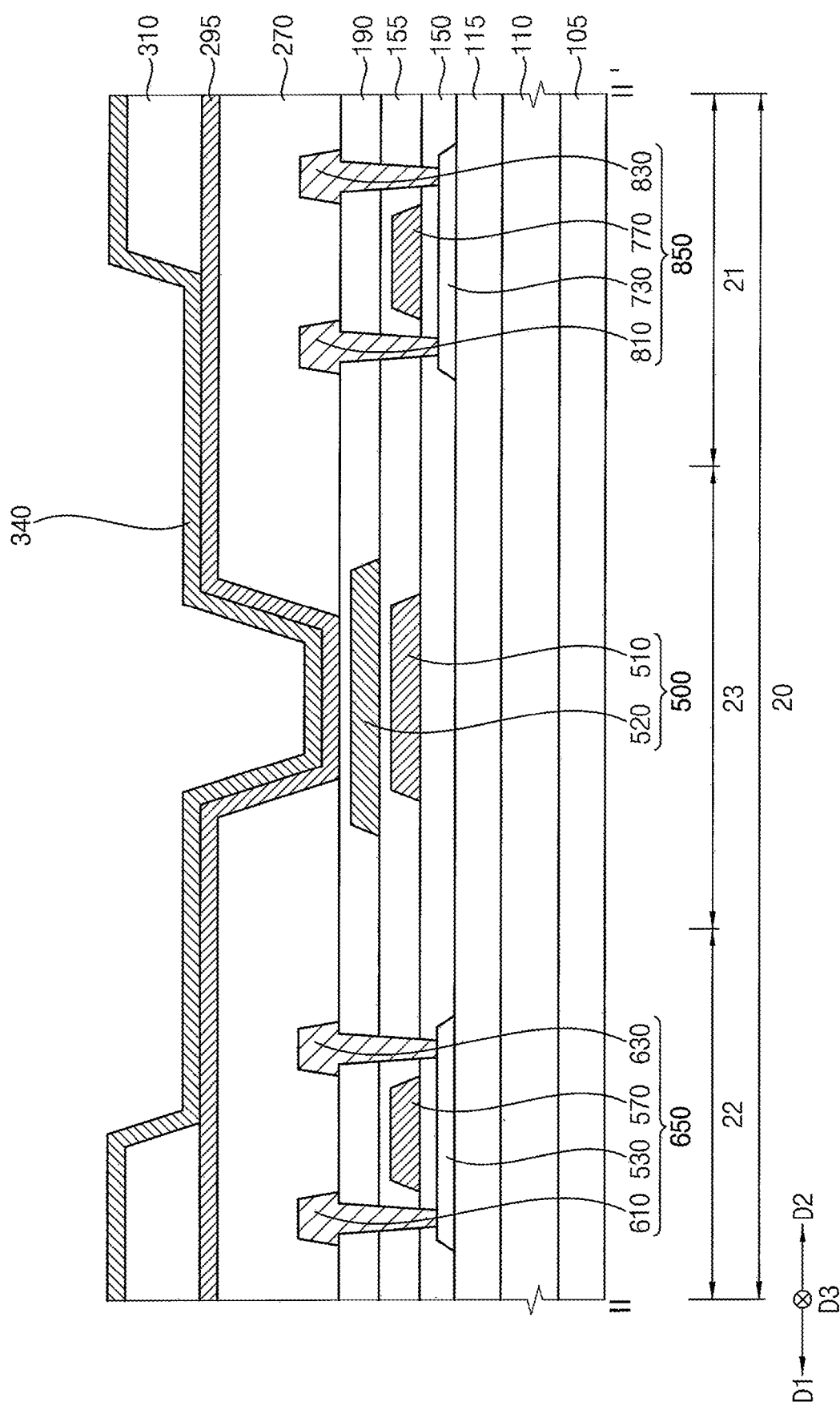

Referring to FIGS. 19 and 20, the light emitting layer 330 may be formed on the first electrode 290 partially exposed by the pixel defining layer 310 in the display area 10. The light emitting layer 330 may be formed by utilizing (e.g., may be formed from) at least one selected from among light emitting materials capable of emitting color lights (such as red light, green light, and blue light) that are different according to pixels. In some embodiments, the light emitting layer 330 may be formed by laminating a plurality of light emitting materials capable of generating different color light such as red light, green light and blue light, such that white light may be emitted as a whole.

The second electrode 340 may be formed in the display area 10 on the pixel defining layer 310 and the light emitting layer 330, and may extend to (e.g., into) the peripheral area 20 to overlap the first opening 271 and the second opening 311 in the peripheral area 20. In example embodiments, the second electrode 340 may come into contact with the connection electrode 295 through the second opening 311. The second electrode 340 may be formed by utilizing (e.g., may be formed from) a metal, an alloy, a metal nitride, a conductive metal oxide, a transparent conductive material, and/or the like.

Accordingly, the pixel structure 200 including the first electrode 290, the light emitting layer 330, and the second electrode 340 may be formed.

Figure 21:
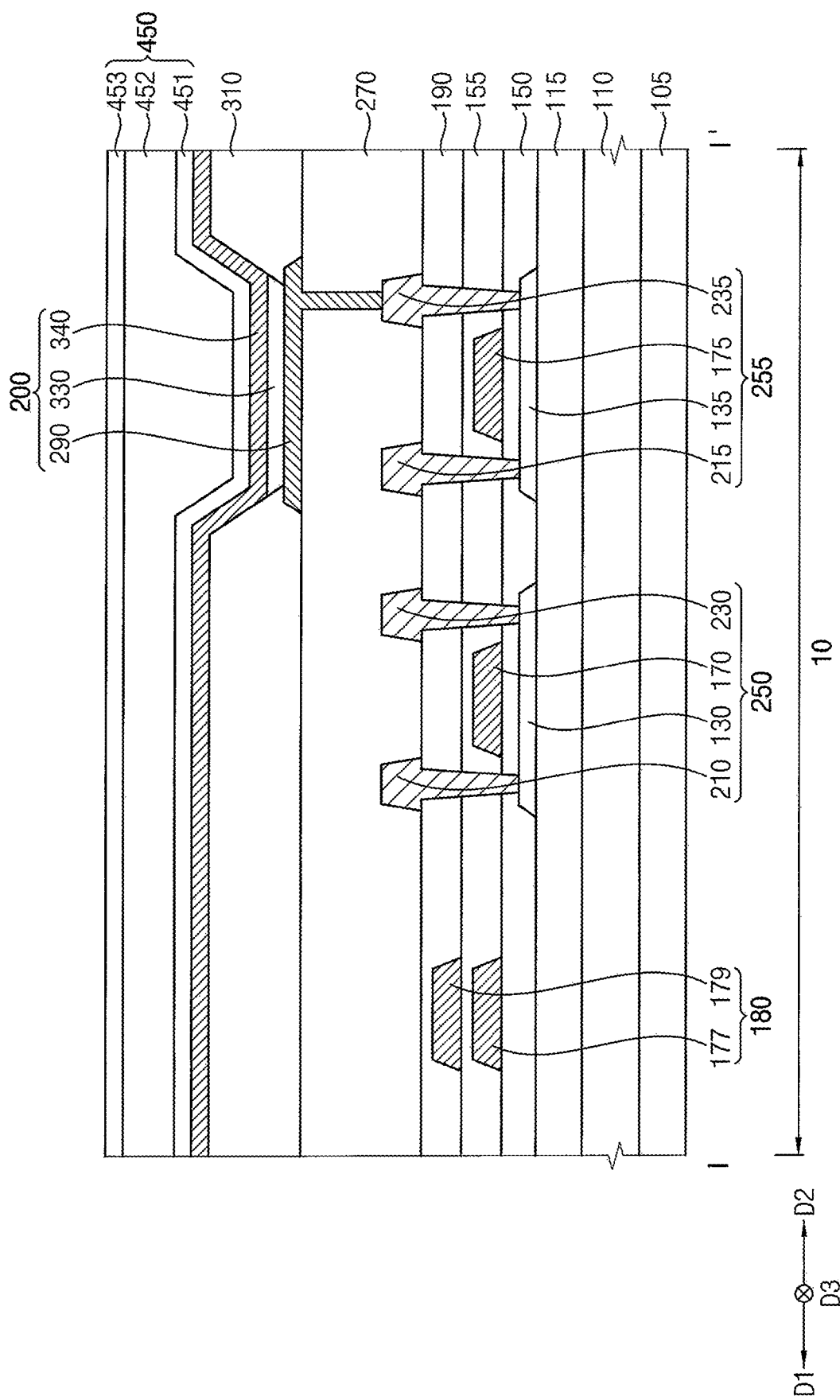
Figure 22:
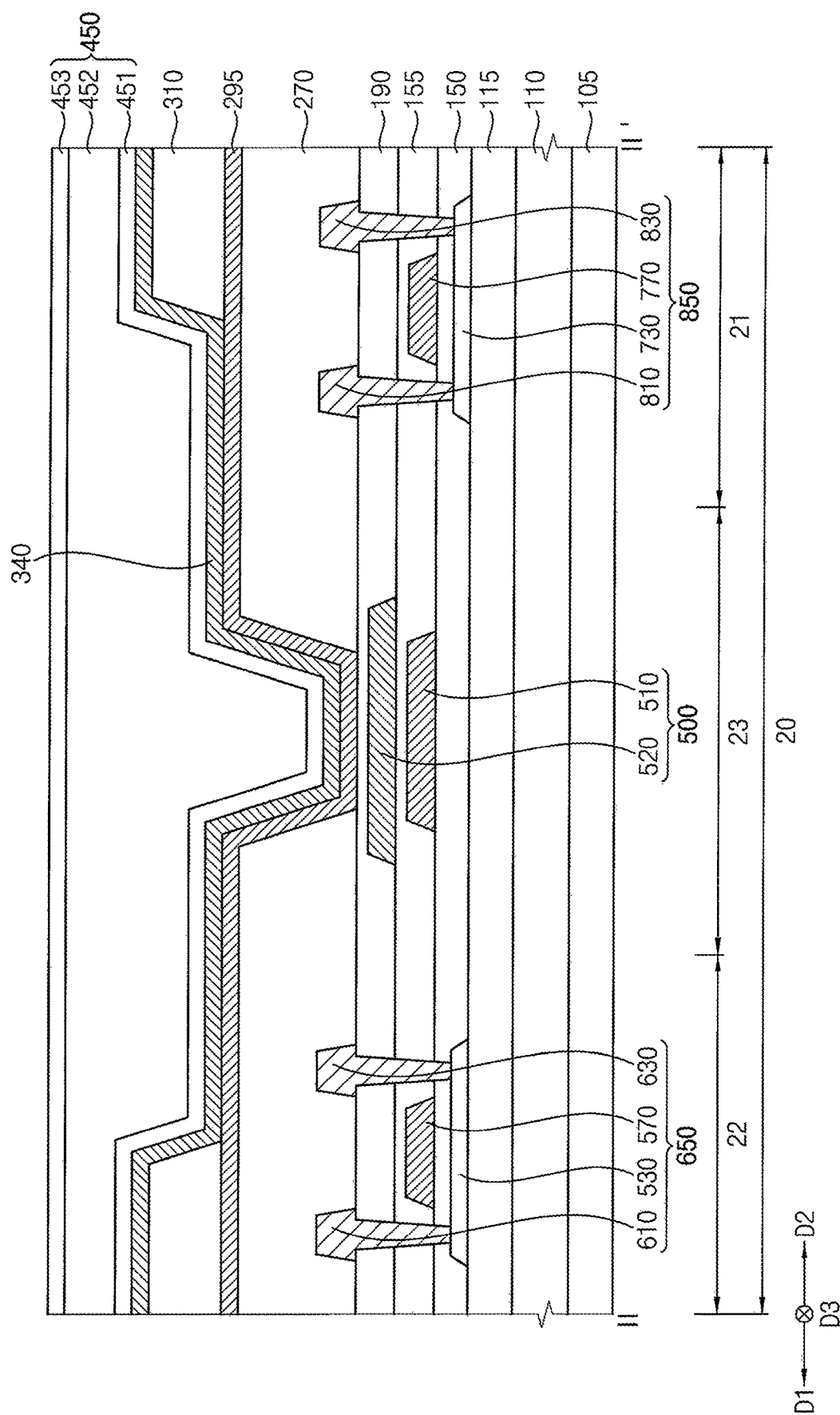

Referring to FIGS. 21 and 22, the first inorganic thin film encapsulation layer 451 may be formed in the display area 10 and the peripheral area 20 on the second electrode 340.

The first inorganic thin film encapsulation layer 451 may be formed by utilizing (e.g., may be formed from) flexible inorganic materials.

The organic thin film encapsulation layer 452 may be formed in the display area 10 and the peripheral area 20 on the first inorganic thin film encapsulation layer 451. The organic thin film encapsulation layer 452 may be formed by utilizing (e.g., may be formed from) flexible organic materials.

The second inorganic thin film encapsulation layer 453 may be formed in the display area 10 and the peripheral area 20 on the organic thin film encapsulation layer 452. The second inorganic thin film encapsulation layer 453 may be formed by utilizing (e.g., may be formed from) flexible inorganic materials.

Accordingly, the thin film encapsulation structure 450 including the first inorganic thin film encapsulation layer 451, the organic thin film encapsulation layer 452, and the second inorganic thin film encapsulation layer 453 may be formed.

After the thin film encapsulation structure 450 is formed, the glass substrate 105 may be removed from the substrate 110. Therefore, the organic light emitting diode display device 100 shown in FIGS. 1 to 9 may be manufactured.

The present disclosure may be applied to various suitable electronic devices including an organic light emitting diode display device. For example, the present disclosure may be applied to a vehicle-display device, a ship-display device, an aircraft-display device, portable communication devices, display devices for display or for information transfer, a medical-display device, etc.

The foregoing is illustrative of example embodiments and is not to be construed as limiting the present disclosure. Although some example embodiments have been described, those skilled in the art will readily appreciate that many modifications are possible in the example embodiments without materially departing from the spirit and scope of the present disclosure. Accordingly, all such modifications are intended to be included within the scope of the present disclosure as defined by the claims and equivalents thereof. Therefore, it is to be understood that the foregoing is illustrative of some example embodiments, and the present disclosure is not to be construed as limited to the disclosed example embodiments, and that modifications to the disclosed example embodiments, as well as other example embodiments, are intended to be included within the scope of the present disclosure as defined by the appended claims and equivalents thereof.

What is claimed is:

1. An organic light emitting diode display device comprising:
   a substrate having a display area and a peripheral area, the peripheral area including a first circuit area, a second circuit area, and a blocking area positioned between the first circuit area and the second circuit area;
   a pixel structure in the display area on the substrate;
   a first circuit transistor in the first circuit area on the substrate;
   a first lower electrode in the blocking area on the substrate and positioned between the first circuit area and the second circuit area;
   a first upper electrode on the first lower electrode and positioned between the first circuit area and the second circuit area, the first upper electrode and the first lower electrode constituting a first capacitor; and
   a planarization layer on the substrate, the planarization layer having a first opening that overlaps the first capacitor in the blocking area.

2. The organic light emitting diode display device of claim 1, wherein the first capacitor and the first circuit transistor define a first circuit structure, and
   wherein the first circuit structure is in the first circuit area and a first portion of the blocking area.

3. The organic light emitting diode display device of claim 2, further comprising:
   a second circuit transistor in the second circuit area on the substrate;
   a second lower electrode in the blocking area on the substrate and spaced apart from the first lower electrode; and
   a second upper electrode on the second lower electrode, the second upper electrode and the second lower electrode constituting a second capacitor.

4. The organic light emitting diode display device of claim 3,
   wherein the second capacitor and the second circuit transistor define a second circuit structure, and
   wherein the second circuit structure is in the second circuit area and a second portion of the blocking area.

5. The organic light emitting diode display device of claim 4, further comprising:
   a first pixel transistor; and
   a second pixel transistor between the substrate and the pixel structure and spaced apart from the first pixel transistor, the second pixel transistor being electrically connected to the pixel structure.

6. The organic light emitting diode display device of claim 5,
   wherein the first circuit structure is configured to generate a gate signal provided to the first pixel transistor, and
   wherein the second circuit structure is configured to generate a light emission control signal provided to the second pixel transistor.

7. The organic light emitting diode display device of claim 3, wherein the second circuit transistor and the second capacitor are electrically connected to each other.

8. The organic light emitting diode display device of claim 3, wherein the first upper electrode is integrally formed with the second upper electrode.

9. The organic light emitting diode display device of claim 1, wherein the first circuit transistor and the first capacitor are electrically connected to each other.

10. The organic light emitting diode display device of claim 1, further comprising:
    a pixel defining layer on the planarization layer, the pixel defining layer having a second opening that overlaps the first opening in the blocking area,
    wherein the first capacitor overlaps the second opening.

11. The organic light emitting diode display device of claim 10, further comprising:
    a first gate insulating layer between the substrate and the planarization layer;
    a second gate insulating layer on the first gate insulating layer while covering the first lower electrode; and
    an insulating interlayer on the second gate insulating layer while covering the first upper electrode.

12. The organic light emitting diode display device of claim 11,
    wherein the first opening is configured to expose a top surface of the insulating interlayer positioned in the blocking area, and wherein a width of the first opening is smaller than a width of the second opening.

13. The organic light emitting diode display device of claim 11, wherein the pixel structure includes:
a first electrode on the planarization layer;
a light emitting layer on the first electrode; and
a second electrode on the light emitting layer.

14. The organic light emitting diode display device of claim 13, wherein the second electrode extends from the display area to the peripheral area to overlap the first opening and the second opening.

15. The organic light emitting diode display device of claim 11, further comprising:
a pixel transistor between the substrate and the pixel structure, the pixel transistor being electrically connected to the pixel structure,
wherein the pixel transistor includes:
an active layer in the display area on the substrate;
a gate electrode in the display area on the first gate insulating layer; and
a source electrode and a drain electrode both in the display area on the insulating interlayer.

16. The organic light emitting diode display device of claim 15, wherein the first lower electrode is positioned on a same layer as the gate electrode.

17. The organic light emitting diode display device of claim 1,
wherein the peripheral area is positioned at a side of the display area, and
wherein the first circuit area is adjacent to the display area.

18. The organic light emitting diode display device of claim 1, further comprising:
a thin film encapsulation structure on the pixel structure,
wherein the thin film encapsulation structure includes:
a first inorganic thin film encapsulation layer extending from the display area to the peripheral area;
an organic thin film encapsulation layer on the first inorganic thin film encapsulation layer; and
a second inorganic thin film encapsulation layer extending from the display area to the peripheral area on the organic thin film encapsulation layer.

19. An organic light emitting diode display device comprising:
a substrate having a display area and a peripheral area including a first circuit area, a second circuit area, and a blocking area positioned between the first circuit area and the second circuit area;
a pixel structure in the display area on the substrate;
a first circuit transistor in the first circuit area on the substrate;
a first lower electrode in the blocking area on the substrate;
a first upper electrode on the first lower electrode, the first upper electrode and the first lower electrode constituting a first capacitor;
a planarization layer on the substrate, the planarization layer having a first opening that overlaps the first capacitor in the blocking area;
a pixel defining layer on the planarization layer, the pixel defining layer having a second opening that overlaps the first opening in the blocking area;
a first gate insulating layer between the substrate and the planarization layer;
a second gate insulating layer on the first gate insulating layer while covering the first lower electrode;
an insulating interlayer on the second gate insulating layer while covering the first upper electrode; and
a connection electrode on the insulating interlayer in the blocking area,
wherein the first capacitor overlaps the second opening,
wherein the pixel structure includes:
a first electrode on the planarization layer;
a light emitting layer on the first electrode; and
a second electrode on the light emitting layer, and
wherein the connection electrode comes into contact with the second electrode and the insulating interlayer through the first opening and the second opening.

20. An organic light emitting diode display device comprising:
a substrate having a display area and a peripheral area including a first circuit area, a second circuit area, and a blocking area positioned between the first circuit area and the second circuit area;
a pixel structure in the display area on the substrate;
a first circuit transistor in the first circuit area on the substrate;
a first lower electrode in the blocking area on the substrate;
a first upper electrode on the first lower electrode, the first upper electrode and the first lower electrode constituting a first capacitor;
a planarization layer on the substrate, the planarization layer having a first opening that overlaps the first capacitor in the blocking area;
a pixel defining layer on the planarization layer, the pixel defining layer having a second opening that overlaps the first opening in the blocking area;
a first gate insulating layer between the substrate and the planarization layer;
a second gate insulating layer on the first gate insulating layer while covering the first lower electrode;
an insulating interlayer on the second gate insulating layer while covering the first upper electrode;
a pixel transistor between the substrate and the pixel structure, the pixel transistor being electrically connected to the pixel structure; and
a storage capacitor spaced apart from the pixel transistor,
wherein the pixel transistor includes:
an active layer in the display area on the substrate;
a gate electrode in the display area on the first gate insulating layer; and
a source electrode and a drain electrode both in the display area on the insulating interlayer,
wherein the first capacitor overlaps the second opening,
wherein the storage capacitor includes:
a lower gate pattern in the display area on the first gate insulating layer; and
an upper gate pattern in the display area on the second gate insulating layer and overlapping the lower gate pattern, and
wherein the first upper electrode is positioned on a same layer as the upper gate pattern.

* * * * *